(12) United States Patent
Musha et al.

(10) Patent No.: US 9,222,993 B2
(45) Date of Patent: Dec. 29, 2015

(54) MAGNETIC SUBSTANCE DETECTION DEVICE

(75) Inventors: Takeshi Musha, Tokyo (JP); Jin Inoue, Tokyo (JP); Hiroshi Nishizawa, Tokyo (JP); Hajime Nakajima, Tokyo (JP); Tomokazu Ogomi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 112 days.

(21) Appl. No.: 13/813,058

(22) PCT Filed: May 12, 2011

(86) PCT No.: PCT/JP2011/060908
§ 371 (c)(1),
(2), (4) Date: Jan. 29, 2013

(87) PCT Pub. No.: WO2012/014546
PCT Pub. Date: Feb. 2, 2012

(65) Prior Publication Data
US 2013/0127457 A1 May 23, 2013

(30) Foreign Application Priority Data

Jul. 30, 2010 (JP) .................. 2010-171245
Jul. 30, 2010 (JP) .................. 2010-171246
Nov. 10, 2010 (JP) .................. 2010-251485
Nov. 10, 2010 (JP) .................. 2010-251487

(51) Int. Cl.
*B60Q 1/00* (2006.01)
*G08B 21/00* (2006.01)
(Continued)

(52) U.S. Cl.
CPC ............. *G01R 33/095* (2013.01); *B82Y 25/00* (2013.01); *G01R 33/093* (2013.01)

(58) Field of Classification Search
CPC ........ G01R 33/09; G01R 33/02; G01R 33/12; G01R 33/06; G01P 3/388; G01D 5/245; G01N 27/72; G01N 33/553; G01B 7/14; G01B 7/30

USPC .............. 324/331, 345, 381, 463, 205, 206, 324/207.13, 207.21, 207.24, 213, 219, 228, 324/232, 246, 252, 259, 260, 262, 529; 338/32 R
See application file for complete search history.

(56) References Cited

U.S. PATENT DOCUMENTS 4,296,377 A * 10/1981 Ohkubo .................. 324/252
4,518,919 A 5/1985 Ishida
(Continued)

FOREIGN PATENT DOCUMENTS

JP 58 2994 1/1983
JP 62 41266 2/1987
(Continued)

OTHER PUBLICATIONS

Machine translation of JP08-178937, Harumi, Shigehiro, Jul. 1996.*
(Continued)

*Primary Examiner* — Patrick Assouad
*Assistant Examiner* — Taqi Nasir
(74) *Attorney, Agent, or Firm* — Oblon, McClelland, Maier & Neustadt, L.L.P.

(57) ABSTRACT

The invention is related to a magnetic substance detection device for detecting a magnetic substance, including: a magnetoresistive sensor arranged in the middle of a movement path of the magnetic substance; and a lower magnet in which a south pole and a north pole are arrayed along the movement direction of the magnetic substance; and a upper magnet in which a north pole and a south pole are arrayed along the movement direction of the magnetic substance. The lower and upper magnets are arranged with the movement path of the magnetic substance interposed so that the south pole of the lower magnet and the north pole of the upper magnet are opposed to each other, and the north pole of the lower magnet and the south pole of the upper magnet are opposed to each other, whereby the magnetic substance can be detected with high accuracy.

13 Claims, 36 Drawing Sheets

(51) Int. Cl.
*G01R 33/09* (2006.01)
*B82Y 25/00* (2011.01)

(56) References Cited

U.S. PATENT DOCUMENTS

| | | | |
|---|---|---|---|
| 5,055,781 | A | 10/1991 | Sakakibara et al. |
| 5,627,466 | A * | 5/1997 | Spies et al. ............... 324/207.21 |
| 5,703,733 | A | 12/1997 | Suzuki et al. |
| 5,781,005 | A * | 7/1998 | Vig et al. .................. 324/207.2 |
| 2004/0207396 | A1* | 10/2004 | Xiao ............................ 324/244 |
| 2008/0238417 | A1* | 10/2008 | Suzuki ......................... 324/228 |
| 2010/0156405 | A1 | 6/2010 | Furukawa et al. |

FOREIGN PATENT DOCUMENTS

| | | | |
|---|---|---|---|
| JP | 1 285817 | | 11/1989 |
| JP | 2 298802 | | 12/1990 |
| JP | 3 73876 | | 3/1991 |
| JP | 4 282481 | | 10/1992 |
| JP | 5 332703 | | 12/1993 |
| JP | 6 167302 | | 6/1994 |
| JP | 6 231336 | | 8/1994 |
| JP | 7 12908 | | 1/1995 |
| JP | 8 178937 | | 7/1996 |
| JP | 08178937 | * | 7/1996 |
| JP | 8 249602 | | 9/1996 |
| JP | 9 152303 | | 6/1997 |
| JP | 10 19601 | | 1/1998 |
| JP | 10019601 | * | 1/1998 |
| JP | 2000 230969 | | 8/2000 |
| JP | 2001 21631 | | 1/2001 |
| JP | 2002 131406 | | 5/2002 |
| JP | 2005 129009 | | 5/2005 |
| JP | 2006 317203 | | 11/2006 |
| WO | 2008 146809 | | 12/2008 |
| WO | WO 2009046350 A1 * | | 4/2009 |
| WO | WO 2010/052797 A1 | | 5/2010 |
| WO | WO 2010052797 A1 * | | 5/2010 |

OTHER PUBLICATIONS

Machine translation of JP10-019601, Endo, Satoshi, Jan. 1998.*
Machine translation of WO2010052797, Ueyama, Naoki, May 2010.*
U.S. Appl. No. 13/812,680, filed Jan. 28, 2013, Ogomi, et al.
Japanese Office Action issued Oct. 1, 2013 in Patent Application No. 2012-526355 with English Translation.
International Search Report Issued Aug. 16, 2011 in PCT/JP11/60908 Filed May 12, 2011.
International Preliminary Report on Patentability issued Feb. 14, 2013 in PCT/JP2011/060908 filed May 12, 2011 submitting English translation only.
Written Opinion issued Aug. 16, 2011 in PCT/JP2011/060908 filed May 12, 2011 submitting English translation only.
Combined Chinese Office Action and Search Report issued Jun. 5, 2014 in Patent Application No. 201180037392.3 (with partial English language translation and English translation of categories of cited documents).

* cited by examiner

Fig.35
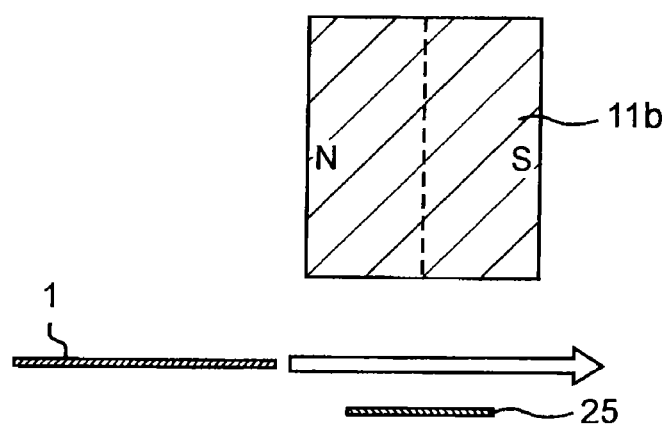
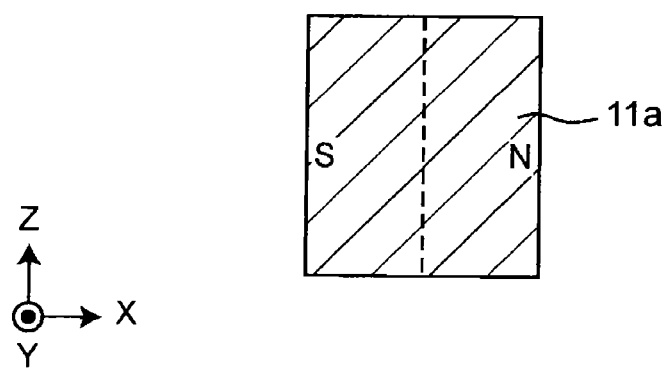

Fig.37
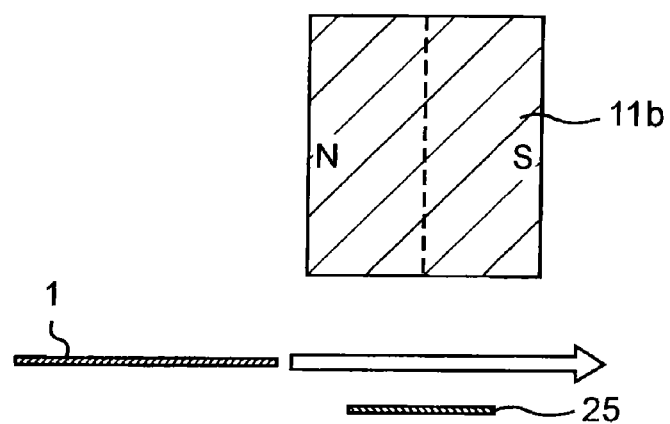
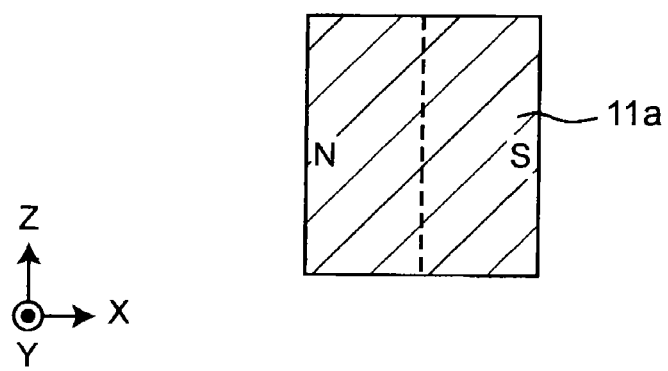

MAGNETIC SUBSTANCE DETECTION DEVICE

TECHNICAL FIELD

The present invention relates to a magnetic substance detection device that detects a magnetic substance, such as magnetic ink printed material, magnetic recording medium, magnetic slit scale or the like.

BACKGROUND

In a conventional magnetic substance detection device, a technique is generally known for detecting a magnetic substance, such as a magnetic ink contained in a bank bill, by combining a magnetoresistive element with a permanent magnet for generating a bias magnetic field. Since a very small amount of the magnetic substance is contained in the bank bill, reading is generally performed in a state where the bank bill is brought into contact with a magnetic sensor head which is composed in combination with the magnetoresistive element and the permanent magnet.

In Patent Document 1 (FIGS. 7 and 8), on the other hand, a pair of magnetic sensor heads are arranged in opposition to each other to allow a material to be detected, such as bank bill, to pass through a gap between both the heads, so that non-contact reading is performed. Moreover, in Patent Document 1, as a magnetoresistive element that detects strength of a magnetic field, a semiconductor magnetoresistive (SMR) element is used. Since a direction in which the semiconductor magnetoresistive element can sense the magnetic field (i.e., magnetosensitive direction) is perpendicular to a detection surface of the element, as to a magnetization direction of a permanent magnet in Patent Document 1, different poles are opposed to each other to apply a bias magnetic field in the direction perpendicular to the detection surface of the element.

Moreover, in Patent document 1, two semiconductor magnetoresistive elements MR1 and MR2 make up a half bridge circuit to extract a midpoint potential for an output signal, so that a change in resistance value of the semiconductor magnetoresistive element that may be caused due to a change in temperature, i.e., output offset fluctuation can be cancelled.

PRIOR ART DOCUMENT

Patent Document

[PATENT DOCUMENT 1] JP 2001-21631 A
[PATENT DOCUMENT 2] JP Utility Model 62-41266 B (1977)
[PATENT DOCUMENT 3] JP 58-2994 A (1958)
[PATENT DOCUMENT 4] JP 6-231336 A (1994)
[PATENT DOCUMENT 5] JP 7-12908 A (1995)
[PATENT DOCUMENT 6] JP 2005-129009 A
[PATENT DOCUMENT 7] JP 5-332703 A (1993)
[PATENT DOCUMENT 8] JP 8-178937 A (1996)
[PATENT DOCUMENT 9] JP 10-19601 A (1998)
[PATENT DOCUMENT 10] JP 8-249602 A (1996)
[PATENT DOCUMENT 11] JP 4-282481 A (1992)
[PATENT DOCUMENT 12] JP 9-152303 A (1997)
[PATENT DOCUMENT 13] JP 6-167302 A (1994)
[PATENT DOCUMENT 14] JP 2-298802 A (1990)
[PATENT DOCUMENT 15] JP 2006-317203 A

SUMMARY OF THE INVENTION

Problem to be Solved by the Invention

The semiconductor magnetoresistive element has characteristics that exhibit larger fluctuations in both of resistance value and rate of change of the resistance value as a temperature rises up, and that the element itself has a small resistance value, because of limitations of materials and processes used. As the resistance value of the element is smaller, a larger consumption current flows through the element in the case of constant voltage driving, and further, the temperature of the element is raised up by self-heating of Joule heat as the amount of current increases, resulting in a reduced rate of change of the resistance and a reduced output. Moreover, in a case there is uneven heat release attributed to assembling to a sensor head casing, resistance values of the upper and lower magnetoresistive elements (MR1 and MR2 in Patent Document 1) of a half bridge are changed by temperature, thereby causing the offset fluctuation in the sensor output (midpoint potential fluctuation).

An object of the present invention is to provide a magnetic substance detection device which can detect a magnetic substance with high accuracy.

Means for Solving the Problem

In order to achieve the above-described object, one aspect of the present invention provides a magnetic substance detection device for detecting a magnetic substance, including:

a magnetoresistive sensor arranged in the middle of a movement path of the magnetic substance; and a bias magnet in which a first magnetic pole and a second magnetic pole having reverse polarity to the first magnetic pole are arrayed along a movement direction of the magnetic substance;

wherein the bias magnet applies a bias magnetic field along the movement direction of the magnetic substance to the magnetoresistive sensor.

In order to achieve the above-described object, one aspect of the present invention provides a magnetic substance detection device for detecting a magnetic substance, including:

a magnetoresistive sensor arranged in the middle of a movement path of the magnetic substance;

a first bias magnet in which the first magnetic pole and the second magnetic pole having the reverse polarity to the first magnetic pole are arrayed along the movement direction of the magnetic substance; and a second bias magnet in which the second magnetic pole and the first magnetic pole are arrayed along the movement direction of the magnetic substance;

wherein the first bias magnet and the second bias magnet are arranged with the movement path of the magnetic substance interposed so that the first magnetic pole of the first bias magnet and the second magnetic pole of the second bias magnet are opposed to each other so as to sandwich the magnetoresistive sensor and the magnetic substance to be detected, and so that the second magnetic pole of the first bias magnet and the first magnetic pole of the second bias magnet are opposed to each other, thereby applying the bias magnetic field along the movement direction of the magnetic substance to the magnetoresistive sensor.

In one aspect of the present invention, the magnetoresistive sensor preferably includes an anisotropic magnetoresistive element, and is positioned around a zero point of bias magnetic field distribution formed by the bias magnet.

In one aspect of the present invention, the magnetoresistive sensor preferably includes an anisotropic magnetoresistive element and is arranged around an intermediate portion of the first magnetic pole and the second magnetic pole with respect to the movement direction of the magnetic substance, the bias magnetic field in the magnetic substance movement direction applied to the magnetoresistive element by the first bias magnet or the pair of the first bias magnet and the second bias magnet is increased or decreased by passage of the magnetic substance, and a change of the magnetic field is converted to output by the magnetoresistive sensor.

In one aspect of the present invention, the magnetoresistive sensor preferably includes an anisotropic magnetoresistive element, and is arranged around a front side of the first magnetic pole or a rear side of the second magnetic pole with respect to the movement direction of the magnetic substance, and a component in a penetrating direction of the bias magnetic field applied to the magnetoresistive element by the first bias magnet or the pair of the first bias magnet and the second bias magnet is rotated by passage of the magnetic substance, and a change of the magnetic field thereof is converted to output by the magnetoresistive sensor.

In one aspect of the present invention, the magnetoresistive sensor preferably includes a half bridge circuit which is built up of both a first anisotropic magnetoresistive element having a magnetosensitive direction parallel to the movement direction of the magnetic substance and a second anisotropic magnetoresistive element having a magnetosensitive direction perpendicular to the movement direction of the magnetic substance.

In one aspect of the present invention, a plurality of magnetoresistive sensors are preferably arranged in a direction perpendicular to the movement direction of the magnetic substance to be constructed as a line sensor.

In one aspect of the present invention, the magnetic substance detection device preferably further includes magnetic yokes provided on upstream and downstream side surfaces in the magnetic substance movement direction of the first bias magnet and the second bias magnet.

In one aspect of the present invention, the magnetic yokes are preferably provided so as to project from the opposed surface of the first bias magnet or the second bias magnet toward the magnetoresistive sensor.

In one aspect of the present invention, the first bias magnet and the second bias magnet are preferably each formed of a prism-shaped magnet of a both-face four-pole magnetization pattern.

In one aspect of the present invention, the bias magnet is preferably divided into a plurality of magnetic poles along the array direction of the magnetoresistive sensors.

In one aspect of the present invention, the magnetic substance detection device preferably further includes:

a processing circuit for processing an output signal from each of the magnetoresistive sensors; and a magnetoresistive sensor for compensation, arranged outside the movement path of the magnetic substance;

wherein the processing circuit compensates the output signal using a signal from the magnetoresistive sensor for compensation.

In one aspect of the present invention, the magnetic substance detection device preferably further includes:

a processing circuit for processing an output signal from each of the magnetoresistive sensors, and a magnetic substance sensing unit for supplying a sensing signal indicating the presence or absence of the magnetic substance in the movement path to the processing circuit;

wherein the processing circuit compensates the output signal when the magnetic substance is present, using the output signal when the magnetic substance is absent.

In one aspect of the present invention, the magnetic substance detection device preferably includes:

a magnetic image sensor in which a plurality of magnetoresistive sensors are arrayed in a matrix; and magnetic field generating means for generating a magnetic field component parallel to an array direction of the magnetoresistive sensors;

wherein each of the magnetoresistive sensors is made up of a plurality of anisotropic magnetoresistive elements.

In one aspect of the present invention, the magnetic substance detection device preferably includes:

a plurality of magnetoresistive sensors arrayed linearly or in a matrix;

wherein each of the magnetoresistive sensors is made up of a plurality of anisotropic magnetoresistive elements formed to be a thin film pattern of a ferromagnetic substance on a substrate, and the respective anisotropic magnetoresistive elements have magnetosensitive directions parallel to a principal surface of the substrate, and parallel or perpendicular to one another.

In one aspect of the present invention, the magnetic substance to be detected preferably has a slit shape formed with a certain pitch along the movement direction, and the magnetic substance detection device further includes a processing circuit for calculating an amount of movement and the movement direction of the magnetic substance, based on the signal of the magnetoresistive sensor.

Effect of the Invention

According to the present invention, a point where the magnetic field is zero exists around an intermediate portion of the respective magnetic poles, and a strong magnetic field gradient is created in a periphery of this zero point. This allows the bias magnetic field applied to the sensor to be set to a desired value in accordance with an installation position of the magnetoresistive sensor used. As a result, the magnetic field change due to the movement of the magnetic substance can be detected with high accuracy.

BRIEF DESCRIPTION OF THE DRAWINGS

FIG. 35 is a side view showing Embodiment 9 of the present invention.

FIG. 37 is a side view showing another example of magnetization arrangement of the magnets.

EMBODIMENT FOR CARRYING OUT THE INVENTION

Figure 1:
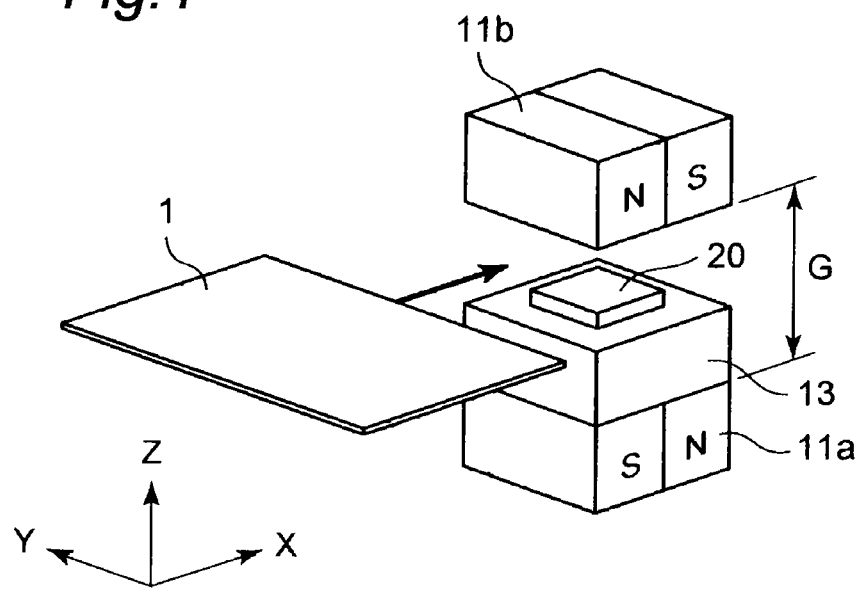
FIG. 1 is a perspective view showing Embodiment 1 of the present invention.

Hereinafter, a magnetic substance detection device according to an embodiment of the present invention will be described with reference to the drawings. In the respective figures, same or similar components are given with the same reference numerals.

Embodiment 1

Figure 2:
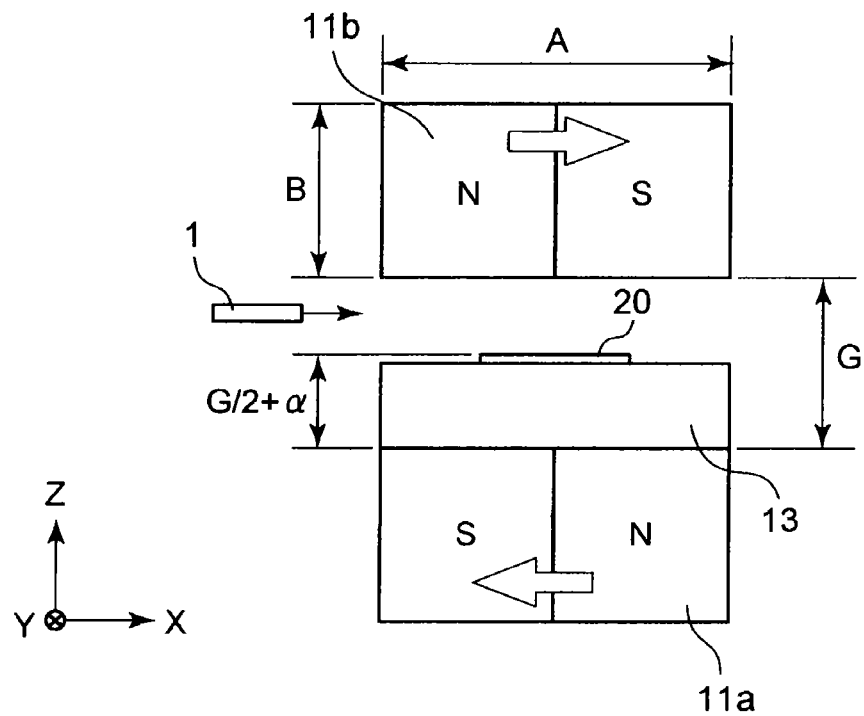
FIG. 2 is a side view showing Embodiment 1 of the present invention.

FIG. 1 is a perspective view showing a magnetic substance detection device according to Embodiment 1 of the present invention, and FIG. 2 is a side view thereof. The magnetic substance detection device includes a lower magnet 11a, an upper magnet 11b, a spacer 13, and a magnetoresistive sensor 20. For easy understanding, a movement direction of a magnetic substance 1 to be detected is defined as X-direction, a direction from the lower magnet 11a to the upper magnet 11b is defined as Z-direction, and a direction perpendicular to both X-direction and Z-direction is defined as Y-direction.

The lower magnet 11a and the upper magnet 11b are arranged in opposition to each other above and below a movement path of the magnetic substance 1, respectively, while maintaining a certain interval of a gap G. The upper magnet 11a and the lower magnet 11b are fixed to a housing (not shown) in order to precisely maintain positions thereof and the gap G.

The magnetoresistive sensor 20 is arranged in the middle of the movement path of the magnetic substance 1 around an almost intermediate portion between opposed surfaces of the lower magnet 11a and the upper magnet 11b, that is, at a position of a distance G/2+α from the lower magnet 11a. In order to precisely position the magnetoresistive sensor 20, the plate-like spacer 13 is located on the opposed surface of the lower magnet 11a. The spacer 13 is formed of a non-magnetic material that does not affect a magnetic field, and the lower magnet 11, the spacer 13, and the magnetoresistive sensor 20 are fixed using an adhesive to thereby stabilize the position of the magnetoresistive sensor 20.

As to magnetization directions of the magnets, the lower magnet 11a is magnetized so that a south pole and a north pole are arrayed in this order along X-direction on the opposed surface thereof. On the other hand, the upper magnet 11b is magnetized so that a north pole and a south pole are arrayed in this order along X-direction on the opposed surface thereof. The south pole of the lower magnet 11a and the north pole of the upper magnet 11b are opposed to each other, and the north pole of the lower magnet 11a and the south pole of the upper magnet 11b are opposed to each other. Incidentally, arrangement of reverse polarity to the foregoing, that is, arrangement in which in the lower magnet 11a, the north pole and the south pole are arrayed in this order, and in the upper magnet 11b, the south pole and the north pole are arrayed in this order may be employed.

In the above-described quadrupole arrangement, there is formed bias magnetic field distribution having magnetic lines extending from the two north poles located at diagonal corners to the two south poles located at the other diagonal corners. In this case, around an intermediate portion of the four magnetic poles, a point where the magnetic field becomes zero exists, so that a strong magnetic field gradient can be created in a periphery of this zero point.

The magnetic substance 1 is conveyed by a well-known conveyance mechanism (not shown) to pass through a space formed between the magnetoresistive sensor 20 and the opposed surface of the upper magnet 11b.

The magnetoresistive sensor 20 may be made up of a semiconductor magnetoresistive (SMR) element, or more preferably, a giant magnetoresistive (GMR) element, a tunnel magnetoresistive (TMR) element, an anisotropic magnetoresistive (AMR) element or the like, each of which is capable of highly-sensitive magnetic field detection. The AMR element is generally formed to be a ferromagnetic thin film which can increase the resistance value of the element and reduce the temperature property, thereby enhancing reliability of the sensor. Furthermore, for the AMR element, although having a lower magnetic saturation level as compared with the semiconductor magnetoresistive (SMR) element, it has a property of exhibiting higher sensitivity in a non-saturation area.

Figure 3:
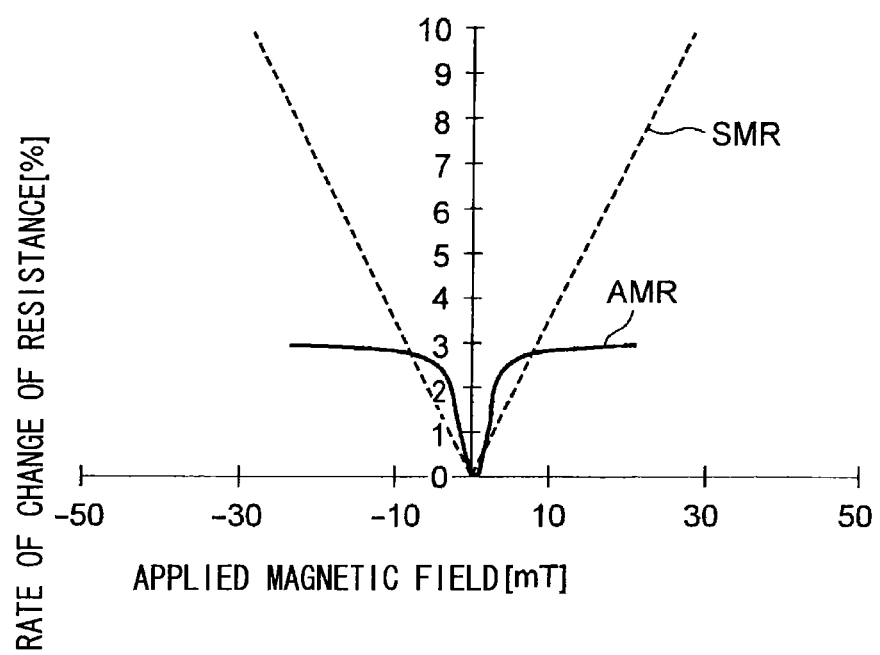
FIG. 3 is a graph showing a relationship of a rate of change of resistance to an externally applied magnetic field in general SMR and AMR elements.

FIG. 3 is a graph showing a relationship of a rate of change of resistance to an externally applied magnetic field in general SMR element and AMR element. The dashed line indicates the SMR element, and the solid line indicates the AMR element. The larger a ratio ($\Delta R/\Delta B$) of a change amount $\Delta R$ of the rate of change of resistance to a change amount $\Delta B$ of the applied magnetic field is, the larger a change of sensor output becomes, and thus, it is desirable that inclination of the resistance change rate curve is larger in view of the sensitivity. Referring to the graph, since the inclination of the resistance change rate curve of the AMR element is larger than that of the SMR element in an area where the applied magnetic field is small, signal stability can be enhanced because of an increased output of the sensor and an increased S/N ratio.

On the other hand, in an area where the applied magnetic field is large, in the case of the AMR element, since a saturation area of the sensitivity exists, the AMR element exhibits a characteristic that there is substantially no rate of change of resistance, that is, the sensor output hardly changes when a certain external magnetic field or higher is applied. Because of the above-described saturation property, if the AMR element is arranged in proximity to the bias magnet, an extremely strong bias magnet field renders the sensor output into a saturation state, so that the sensor output does not change even when the magnetic substance goes through. Moreover, when a weak bias magnetic field is applied so that the AMR element does not reach the saturation area, an extremely small magnetic field is applied to the magnetic substance so that the change of the magnetic field caused by the presence or absence of the magnetic substance is smaller, resulting in a property that the sensor output is lowered.

Figure 4:
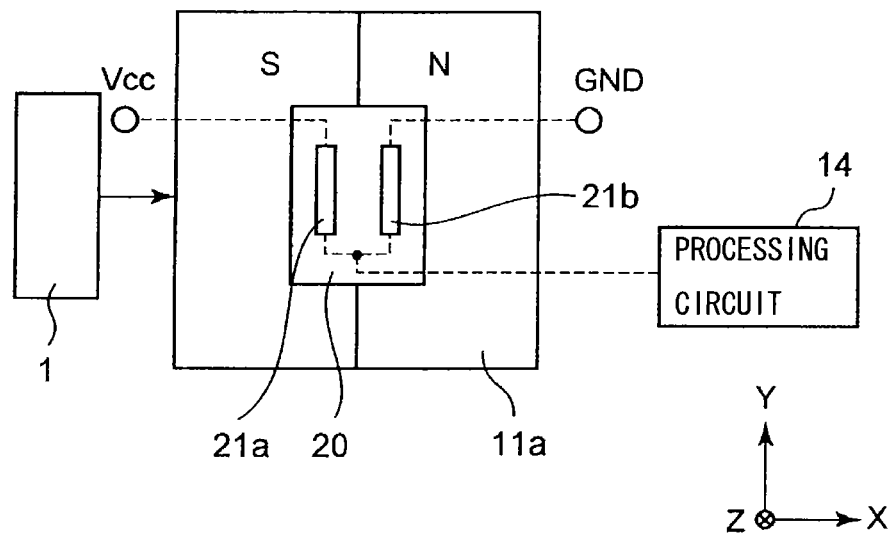
FIG. 4 is a plan view showing a magnetoresistive sensor and an opposed surface of a lower magnet.

FIG. 4 is a plan view showing a magnetoresistive sensor 20 and the opposed surface of the lower magnet 11a. Here, a case where the magnetoresistive sensor 20 are made up of two AMR elements 21a and 21b is exemplified. The AMR elements 21a and 21b are formed to be a thin film pattern of a ferromagnetic substance on a substrate. When they are each formed in an elongated strip shape as illustrated, a direction which is perpendicular to the longitudinal direction thereof and parallel to the principal surface of the substrate is a magnetosensitive direction. In this embodiment, the magnetosensitive direction of the AMR elements 21a and 21b is set to be parallel to the movement direction (X-direction) of the magnetic substance 1, and thus the resistance value of each of the elements can change in accordance with a change of the magnetic field $Bx$ in X-direction.

The AMR elements 21a and 21b are connected in series between a power supply line Vcc and a ground line GND to build up a half bridge circuit. The midpoint potential thereof is supplied as an output signal to a subsequent processing circuit 14 in which the output signal is subjected to amplification and various types of signal processing.

Figure 5:
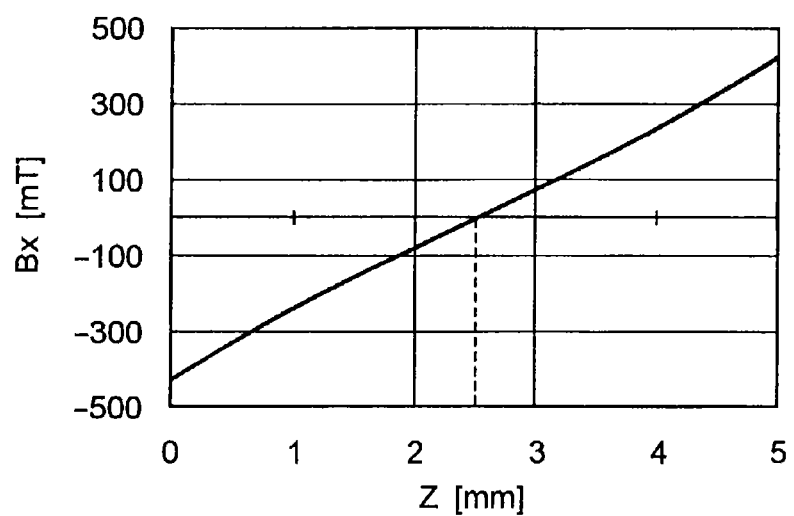
FIG. 5 is a graph in which an X component Bx of a magnetic field is plotted along Z-axis direction passing a magnetic field zero point.

FIG. 5 is a graph in which the X component $Bx$ of the magnetic field is plotted along Z-axis direction passing the magnetic field zero point. The bias magnetic field distribution formed by the magnets 11a and 11b was calculated using two-dimensional simulation. The horizontal axis indicates a Z-direction distance measured from the opposed surface of the lower magnet 11a, and the vertical axis indicates the X component $Bx$ of the generated magnetic field. Dimensions of the magnets 11a and 11b are A=10 mm, B=5 mm and G=5 mm with reference to FIG. 2, and as for material, general neodymium sintered magnets are used.

Referring to the graph, it is found that the magnetic field $Bx$ is zero at a middle point of both the magnets (Z=2.5 mm). By selecting a line width and a film thickness of the magnetoresistive element as needed, sensitivity inclination and saturation magnetic field can be changed. For example, as shown as a solid line in FIG. 3, when using the magnetoresistive element with the saturation magnetic field of 5 mT as a typical value, $Bx$ becomes 5 mT around Z=2.55 mm. That is, an offset position $\alpha$ of the magnetoresistive sensor 20 is preferably set to satisfy $0<\alpha<0.05$ mm, so that a proper bias magnetic field can be applied without saturating the output of the magnetoresistive element. More preferably, the highest output can be obtained by positioning the magnetoresistive sensor 20 around $\alpha$=0.025 mm in a state where the bias magnetic field of about $Bx$=2.5 mT, at which the magnetoresistive element has the largest sensitivity inclination, is applied.

Next, the operation will be described. The magnetic substance 1 is conveyed in X-direction while the bias magnetic field $Bx$ is constantly applied to the magnetoresistive sensor 20 (e.g., the AMR elements 21a and 21b in FIG. 4). When the magnetic substance 1 approaches the upstream AMR element 21a, the magnetic field $Bx$ around the AMR element 21a changes, but the magnetic field $Bx$ around the downstream AMR element 21b does not change, and thus only the resistance value of the AMR element 21a is changed, and the midpoint potential is also changed. Subsequently, when the magnetic substance 1 further moves in X-direction to approach the downstream AMR element 21b, the magnetic field Bx around the AMR element 21b also comes to change, and the resistance values of the respective elements are both changed, so that the midpoint potential returns to the same potential as that when the magnetic substance is absent. Subsequently, when the magnetic substance 1 further moves in X-direction, only the resistance value of the downstream AMR element 21b is changed, and at this time the midpoint potential is changed in a reverse direction to the foregoing. Subsequently, when the magnetic substance 1 moves away from the AMR element 21b, the midpoint potential returns to the same potential as that when the magnetic substance is absent.

In this manner, since the midpoint potential is changed in the following sequence of a steady-state value→a change to a positive side (or negative side)→the steady-state value→a change to a negative side (or positive side)→the steady-state value, the operation corresponds to detection of an edge of the magnetic substance. The change of the magnetic field when the magnetic substance passes by the AMR element is proportional to the magnetic field at the periphery of the magnetic substance 1 (i.e., the applied magnetic field of the magnetic substance 1), and the change of the magnetic field is detected by the AMR element, and thus the larger magnetic field needs to be applied to the magnetic substance 1 for obtaining the higher output.

In this embodiment, for example, when the magnetic substance 1 passes through in a vicinity of Z=3 mm, the applied magnetic field to the magnetic substance 1 shows Bx=about 77 mT with reference to the graph in FIG. 5. On the other hand, when the magnetic substance 1 passes through in a vicinity of Z=4 mm, the applied magnetic field to the magnetic substance 1 shows Bx=about 240 mT, and the magnetic field about three times as high as the magnetic field at Z=3 mm is applied to the magnetic substance 1.

Generally, when the magnetic substance passes through a uniform magnetic field, and the change of the magnetic field caused by the magnetic substance is constant regardless of the position of the magnetic substance, as the magnetic substance is closer to the magnetoresistive element, the change of the magnetic field caused by the magnetic substance and the change of the magnetic field in the vicinity of the magnetoresistive element have values closer to each other, thereby obtaining the larger output. On the contrary, as the magnetic substance is more distant from the magnetoresistive element, the change of the magnetic field in the vicinity of the magnetoresistive element becomes smaller than the change of the magnetic field caused by the magnetic substance, resulting in the lowered output.

In contrast, in this embodiment, since a strong magnetic field gradient is created in the periphery of the zero point, as the magnetic substance 1 is more distant from the magnetoresistive sensor 20, the larger magnetic field is applied to the magnetic substance 1. Therefore, decreasing of the output attributed to the magnetic substance 1 being more distant from the magnetoresistive sensor 20 can be suppressed by increasing of the applied magnetic field. As a result, even if a distance between the magnetic substance 1 and the magnetoresistive sensor 20 fluctuates, the stable output signal can be obtained.

As described above, according to this embodiment, by creating the strong magnetic field gradient in the periphery of the magnetic field zero point, the strength of the magnetic field applied to the magnetoresistive sensor 20 can be adjusted. Accordingly, the desired bias magnetic field can be easily set in accordance with the characteristics of the magnetoresistive sensor used. For example, when the anisotropic magnetoresistive (AMR) element is used for the magnetoresistive sensor 20, the element is positioned around the zero point, whereby the highly-sensitive magnetic field detection can be realized while suppressing the sensitivity saturation.

Moreover, when the magnetic substance 1 passes between the magnets 11a and 11b, as the magnetic substance 1 is more distant from the zero point, the strength of the magnetic field applied to the magnetic substance 1 becomes larger, and the amount of change of the magnetic field due to movement of the magnetic substance is also increased. Thus, even if the distance between the magnetic substance 1 and the magnetoresistive sensor 20 fluctuates, the amount of change of the magnetic field is changed so as to compensate the distance fluctuation. As a result, the output signal of the magnetoresistive sensor 20 is stabilized, and the highly-sensitive non-contact magnetic substance detection is realized.

Moreover, in Patent Document 1, two permanent magnets and two magnetoresistive elements are required to be opposed for non-contact detection, while according to the present embodiment, the non-contact detection using the single magnetoresistive sensor 20 is realized. Particularly, since the relatively expensive magnetoresistive sensors can be reduced in number, cost reduction of the whole device can be achieved.

Embodiment 2

Figure 6:
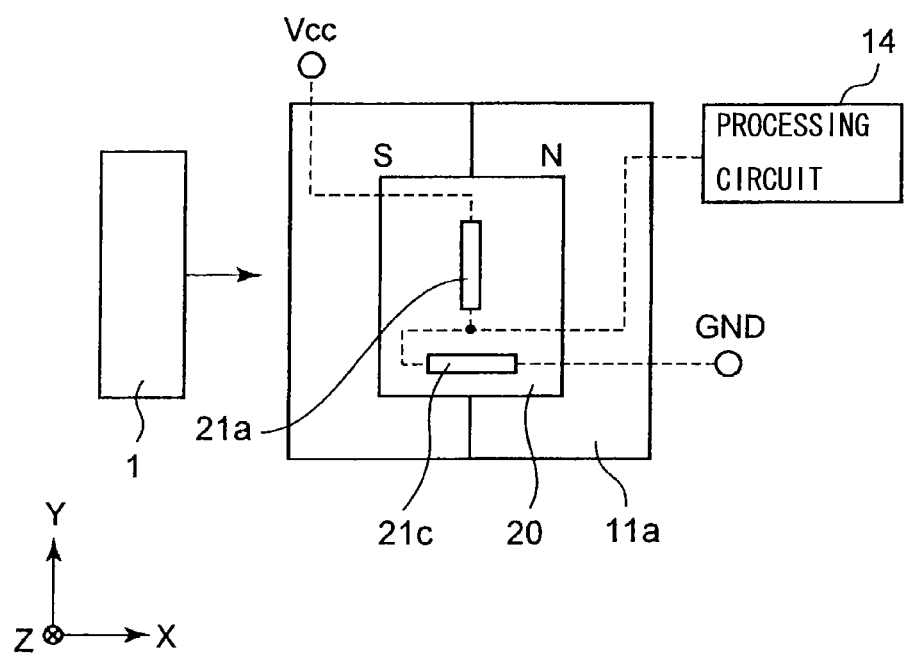
FIG. 6 is a plan view showing Embodiment 2 of the present invention.

FIG. 6 is a plan view showing Embodiment 2 of the present invention. This whole device is similar in configuration to Embodiment 1. The magnetoresistive substance detection device includes the lower magnet 11a, the upper magnet 11b, the spacer 13, and the magnetoresistive sensor 20 as shown in FIG. 1. Here, similar to FIG. 4, a case where the magnetoresistive sensor 20 may be made up of two AMR elements 21a and 21b is exemplified. Alternatively, it may be made up of semiconductor magnetoresistive (SMR) elements, giant magnetoresistive (GMR) elements, tunnel magnetoresistive (TMR) elements or the like.

In this embodiment, the arrangement of the AMR elements 21a and 21b are different from that of Embodiment 1. The AMR elements 21a and 21b are formed to be a thin film pattern of a ferromagnetic substance on a substrate. When they are each formed in an elongated strip shape as illustrated, a direction which is perpendicular to the longitudinal direction thereof and parallel to the principal surface of the substrate is a magnetosensitive direction.

In this embodiment, the magnetosensitive direction of the AMR element 21a is set to be parallel to the movement direction of the magnetic substance 1 (X-direction), and the resistance value of the element can change in accordance with a change of a magnetic field Bx in X-direction. On the other hand, the magnetosensitive direction of the AMR element 21b is set to be a direction perpendicular to the movement direction of the magnetic substance 1 (Y-direction), and is arranged so that the resistance value of the element does not change in accordance with the change of the magnetic field Bx.

The AMR elements 21a and 21b are connected in series between a power supply line Vcc and a ground line GND to build up a half bridge circuit. The midpoint potential thereof is supplied as an output signal to a subsequent processing circuit 14 in which the output signal is subjected to amplification and various types of signal processing.

According to the above-described element arrangement, when the bias magnetic field Bx is applied in X-direction, the bias magnetic field Bx is applied to the AMR element 21a, while the bias magnetic field is not applied to the AMR element 21b, because the bias magnetic field Bx is perpendicular to the magnetosensitive direction thereof. In this state, when the magnetic substance 1 moves in X-direction to approach the AMR element 21a, the magnetic field Bx around the AMR element 21a changes, so that the resistance value of the element is changed. On the other hand, when the magnetic substance 1 approaches the AMR element 21b, even if the magnetic field Bx around the AMR element 21b changes, the change of the magnetic field cannot be detected and the resistance value of the AMR element 21b is constant. In this case, the midpoint potential is changed when the magnetic substance 1 is present above the magnetoresistive sensor 20, while the midpoint potential is not changed when the magnetic substance 1 is absent above the magnetoresistive sensor 20. That is, as for operation, edge detection of the magnetic substance as described in Embodiment 1 is not performed, but existence of the magnetic substance itself can be detected.

In the case of edge detection of the magnetic substance, because of an unstable edge shape there is a possibility that a waveform at an edge does not appear, or that it is difficult to determine the magnetic substance if the edge portion is not read out due to influence of electromagnetic noise or the like. In contrast, in this embodiment, the edge of the magnetic substance is not detected, but the existence of the magnetic substance itself is detected, whereby the magnetic substance can be stably detected without depending on the edge shape of the magnetic substance. Consequently, a stable magnetic substance detection signal tolerant of exogenous noise can be obtained.

Moreover, in this embodiment, similar to Embodiment 1, by creating a strong magnetic field gradient in the periphery of a magnetic field zero point, the strength of the magnetic field applied to the magnetoresistive sensor 20 can be adjusted, and the desired bias magnetic field can be easily set in accordance with the characteristics of the magnetoresistive sensor used. Furthermore, even if the distance between the magnetic substance 1 and the magnetoresistive sensor 20 fluctuates, the stable output signal can be obtained, thereby realizing highly-sensitive non-contact magnetic substance detection.

Embodiment 3

Figure 7:
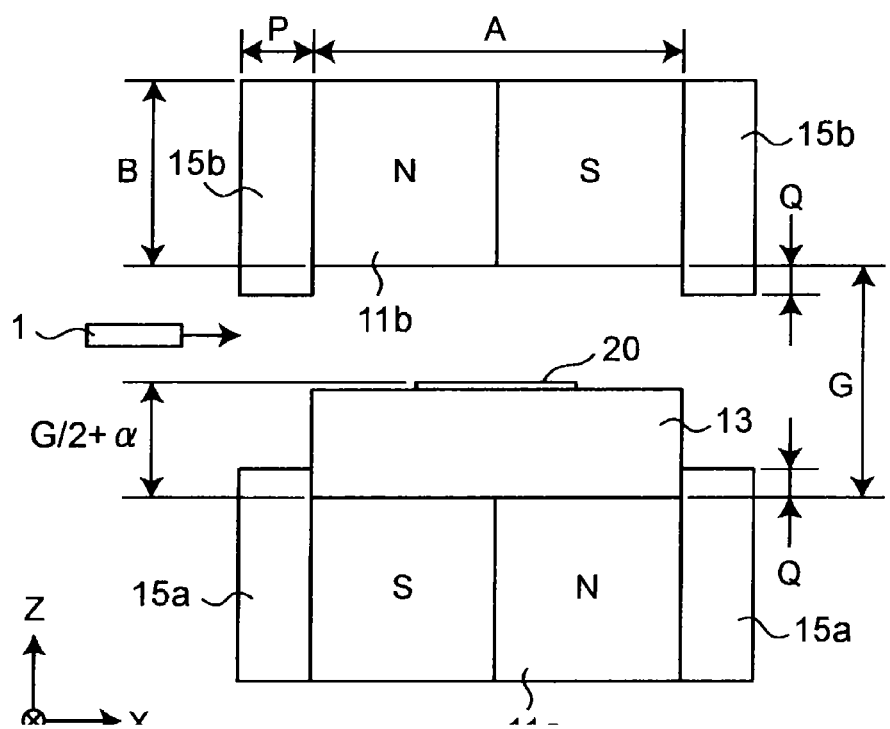
FIG. 7 is a side view showing Embodiment 3 of the present invention.

FIG. 7 is a side view showing Embodiment 3 of the present invention. This whole device is similar in configuration to Embodiments 1 and 2. The magnetic substance detection device includes lower yokes 15a and upper yokes 15b in addition to the lower magnet 11a, the upper magnet 11b, the spacer 13 and the magnetoresistive sensor 20. The magnetoresistive sensor 20 according to both Embodiments 1 and 2 can be utilized in this embodiment.

The lower yokes 15a are each formed of a plate-like magnetic substance (e.g., iron or the like) having a thickness P, and are attached to both side surfaces of the lower magnet 11a, that is, an upstream surface and a downstream surface along X-direction in which the magnet substance 1 moves, by means of, e.g., adhesion, integral molding, and attraction by magnetic force. Upper ends of the lower yokes 15a preferably project by a predetermined amount of projection Q in +Z-direction with respect to an upper opposed surface of the lower magnet 11a. Similarly, the upper yokes 15b are each formed of a plate-like magnetic substance having the thickness P, and are attached to both side surfaces of the upper magnet 11b, that is, an upstream surface and a downstream surface along X-direction in which the magnet substance 1 moves, by means of, e.g., adhesion, integral molding, and attraction by magnetic force. Lower ends of the upper yokes 15b preferably project by the predetermined amount of projection Q in −Z-direction with respect to a lower opposed surface of the upper magnet 11b.

Figure 8:
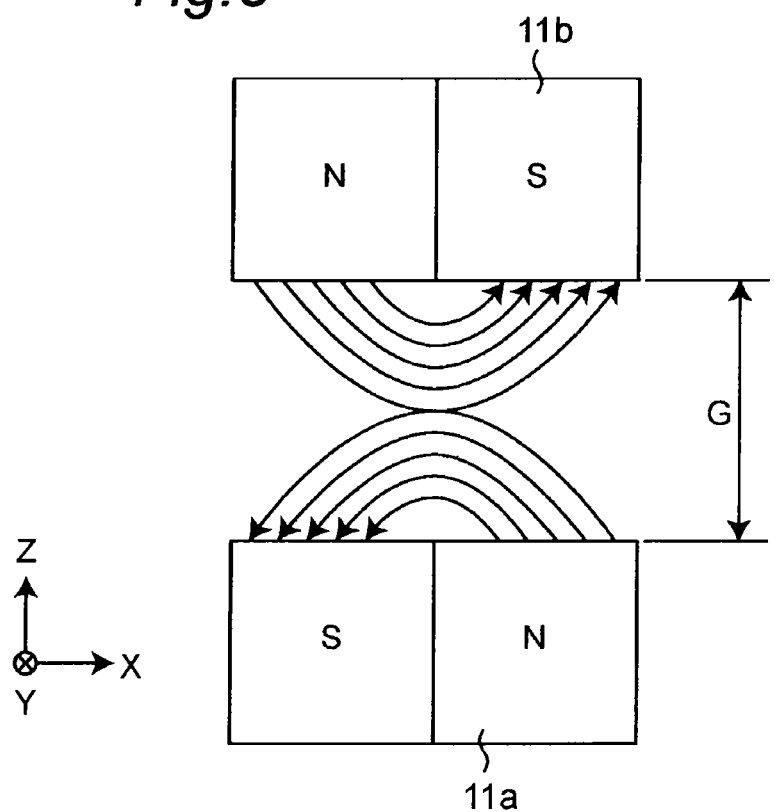
FIG. 8 is a side view showing magnetic line distribution in Embodiment 1 of the present invention.
Figure 9:
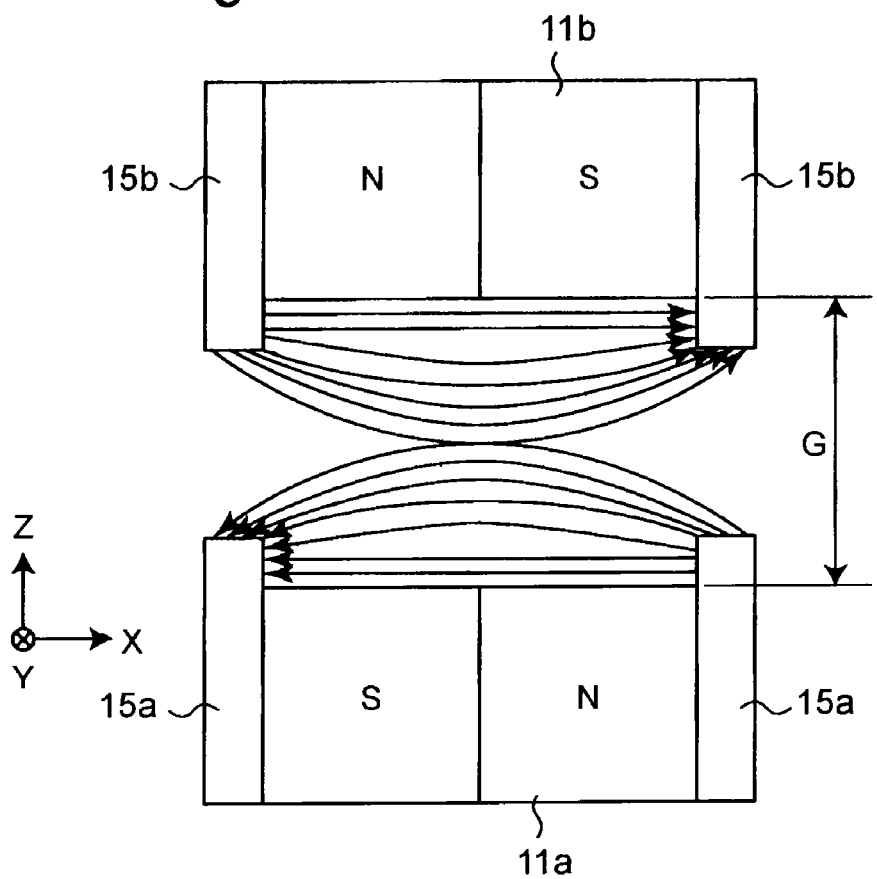
FIG. 9 is a side view showing magnetic line distribution in Embodiment 3 of the present invention.

Next, an effect of this embodiment will be described with reference to FIGS. 8 to 11. When the magnets are arranged vertically in opposition to each other as described in Embodiments 1 and 2, each magnetic line thereof draws a loop where the line extends from the whole magnetic surface of a north pole of the magnet to the whole surface of a south pole as shown in FIG. 8. In contrast, when the yokes are attached to the upper and lower magnets according to this embodiment, each magnetic line draws a loop where the line extends from a yoke end on the north pole side of each of the magnets to another yoke end of the south pole, as shown in FIG. 9.

This installation of the yokes enables the magnetic lines to be concentrated on an area through which the magnetic substance 1 to be detected passes, thereby supplying the still larger magnetic field applied to the magnetic substance 1, as compared with that when only the opposed magnets are present. As a result, since the output signal is further stabilized even when the distance between the magnetic substance 1 and the magnetoresistive sensor 20 fluctuates, the more highly-sensitive non-contact magnetic substance detection is realized.

Figure 10:
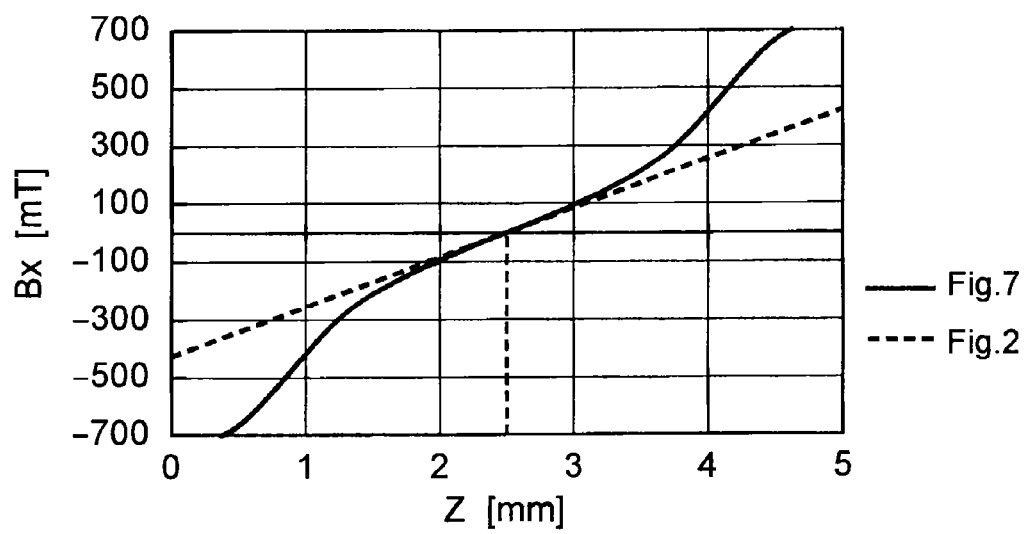
FIG. 10 is a graph in which the X component Bx of the magnetic field is plotted along Z-axis direction passing the magnetic field zero point.

FIG. 10 is a graph in which the X component Bx of the magnetic field is plotted along Z-axis direction passing the magnetic field zero point. The bias magnetic field distribution formed by the magnets 11a and 11b and the yokes 15a and 15b was calculated using two-dimensional simulation. The horizontal axis indicates a Z-direction distance measured from the opposed surface of the lower yoke 15a, and the vertical axis indicates the X component Bx of the generated magnetic field. Dimensions of the magnets 11a and 11b are A=10 mm, B=3 mm, and G=7 mm with reference to FIG. 7, dimensions of the yokes are P=1 mm, Q=1 mm and as for material, general neodymium sintered magnets are used for the magnets, and general iron materials are used for the yokes.

The solid line indicates magnetic field distribution created by yoke installation according to this embodiment, and the dashed line indicates for comparison the magnetic field distribution (FIG. 5) created by the magnet arrangement of Embodiment 1.

Comparing the solid line and the dashed line, it is found that although they are common in that the magnetic field Bx becomes zero at the middle point (Z=2.5 mm) of both the magnets, the solid line tends to draw an S-curve, and the Bx components around the magnetic field zero point are almost equal in the dashed line and the dot line, while the solid line indicates that the Bx component largely increases in the area through which the magnetic substance passes, that is, at a point where the magnetic substance is distant from the magnets. This is because magnetic lines are concentrated around the yokes, as described above.

In this embodiment, for example, when the magnetic substance 1 passes through in a vicinity of Z=3 mm, the applied magnetic field to the magnetic substance 1 shows Bx=about 80 mT, which is almost equal to that of Embodiment 1 with reference to the graph of FIG. 10. On the other hand, when the magnetic substance 1 passes through in a vicinity of Z=4 mm, the applied magnetic field to the magnetic substance 1 shows Bx=about 420 mT, thereby applying the larger magnetic field than that of Embodiment 1 to the magnetic substance 1.

Figure 11:
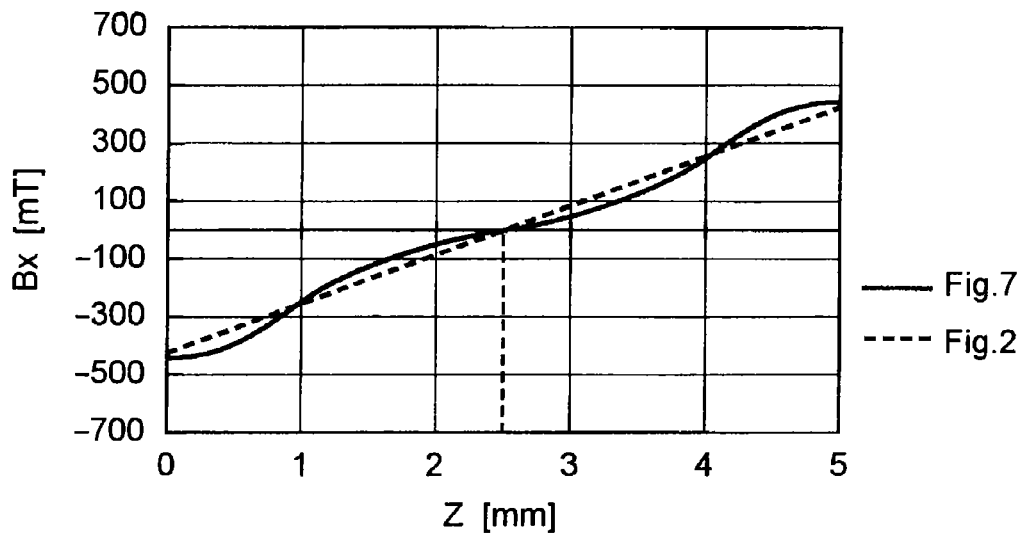
FIG. 11 is a graph in which the X component Bx of the magnetic field is plotted along Z-axis direction passing the magnetic field zero point.

Moreover, in this embodiment by selecting magnetic force that each of the magnets has (remanent flux density), magnetic field distribution as shown in FIG. 11 can be created. FIG. 11 shows a simulation result on the assumption of a magnet material having a shape similar to that of FIG. 10 whose remanent flux density is reduced by 40%. In the case of Embodiment 1, although α can be set in a range of 0<α<0.05 mm, which means that an assembling error in Z-direction between the lower magnet 11a and the magnetoresistive sensor 20 should be suppressed to 0.5 mm or less. When a value of α is small, a thickness tolerance of the spacer 13, a thickness of the magnetoresistive sensor 20, tolerances at the time of assembling and the like need to be strictly managed, which is not preferable in view of a yield ratio, and costs and quality as a product. On the other hand, when inclination of the Bx is made smaller around the magnetic field zero point as shown in FIG. 11, even if the magnetoresistive sensor 20 is arranged with some degrees of tolerance in Z-direction, the change of the bias magnetic field applied to the magnetoresistive sensor is small, and thus a value of α can be made larger than that of Embodiment 1. In FIG. 11, Bx is 5 mT around Z=2.58 mm. That is, the offset position α of the magnetoresistive sensor 20 can be set to 0<α<0.08 mm, and as compared with FIG. 10, reduction in cost and enhancement in quality by alleviation of assembling accuracy can be expected.

On the other hand, when the area through which the magnetic substance passes is set to Z=4 mm or more, the larger magnetic field can be applied to the magnetic substance 1, as compared with that of Embodiment 1, and the output signal can be further stabilized even when the magnetic substance distance fluctuates, thereby realizing the highly-sensitive non-contact magnetic substance detection.

Embodiment 4

Figure 12:
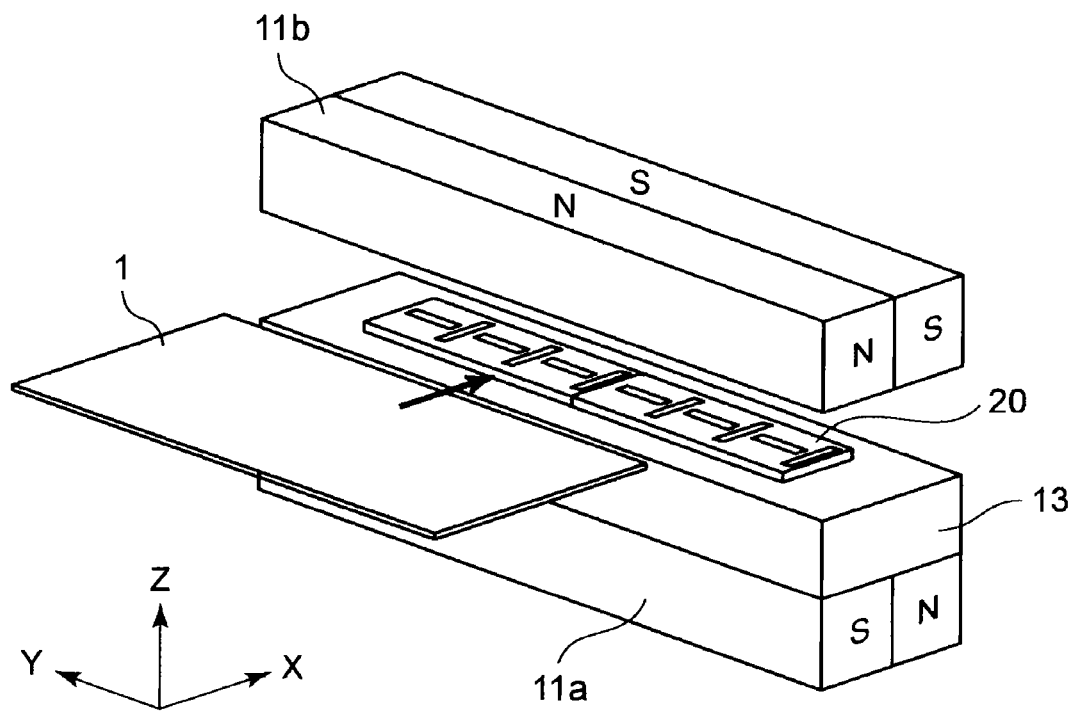
FIG. 12 is a perspective view showing Embodiment 4 of the present invention.

FIG. 12 is a perspective view showing Fourth embodiment of the present invention. A magnetic substance detection device includes a lower magnet 11a, an upper magnet 11b, a spacer 13, and a magnetoresistive sensor 20. In this embodiment the arrangement of the magnets 11a and 11b and magnetic field distribution formed by this arrangement are similar to those in Embodiment 1, but the magnetoresistive sensors 20 are constructed as a line sensor. Here, similar to FIG. 4, a case where the magnetoresistive sensor 20 may be made up of a number of AMR elements is exemplified. Alternatively, it may be made up of semiconductor magnetoresistive (SMR) elements, giant magnetoresistive (GMR) elements, tunnel magnetoresistive (TMR) elements or the like.

The magnetoresistive sensors 20 build up the line sensor by arraying a plurality of array units in a linear fashion with perpendicular pattern arrangement used as one array unit, the perpendicular pattern arrangement being such that two AMR elements 21a and 21b are arranged so as to each have a magnetosensitive direction perpendicular to each other, as shown in FIG. 6.

Alternatively, the magnetoresistive sensors 20 may build up the line sensor by arraying a plurality of array units in a linear fashion with parallel pattern arrangement used as one array unit, the parallel pattern arrangement being such that the two AMR elements 21a and 21b are arranged so as to each have a magnetosensitive direction parallel to each other, as shown in FIG. 4.

By using the magnetoresistive sensors 20 which are constructed as the line sensor in the above-described manner, a change of the magnetic field caused by movement of a magnetic substance 1 can be detected in a linear fashion, so that high-speed magnetic reading with a high spatial resolution can be realized.

Moreover, in this embodiment, similar to Embodiment 1, by creating a strong magnetic field gradient in the periphery of a magnetic field zero point, the strength of the magnetic field applied to the magnetoresistive sensors 20 can be adjusted, and the desired bias magnetic field can be set in accordance with the characteristics of the magnetoresistive sensors used. Furthermore, even if the distance between the magnetic substance 1 and the magnetoresistive sensors 20 fluctuates, the stable output signal can be obtained, thereby realizing highly-sensitive non-contact magnetic substance detection.

Further, in this embodiment as well, magnetic yokes can be attached to both side surfaces of the upper and lower magnets 11a and 11b as described in Embodiment 3. This allows the output signal to be further stabilized when the magnetic substance distance fluctuates, thereby realizing highly-sensitive non-contact magnetic substance detection. Furthermore, reduction in cost and enhancement in quality by alleviation of assembling accuracy by increase of an offset position α of the magnetoresistive sensors 20 can be achieved.

Particularly, in this embodiment, since the upper and lower magnets 11a and 11b each have an elongated shape in Y-axis direction, it is difficult to keep uniformity of the magnets, thereby causing a possibility that variation occurs among output terminals. However, by attaching the magnetic yokes to both the side surfaces of the upper and lower magnets 11a and 11b, stable magnetic field distribution can be formed regardless of the magnetic force variation of the magnets. As a result, reduction in cost and enhancement in quality due to an increase in yield ratio of each of the magnets can be achieved.

Embodiment 5

Figure 13:
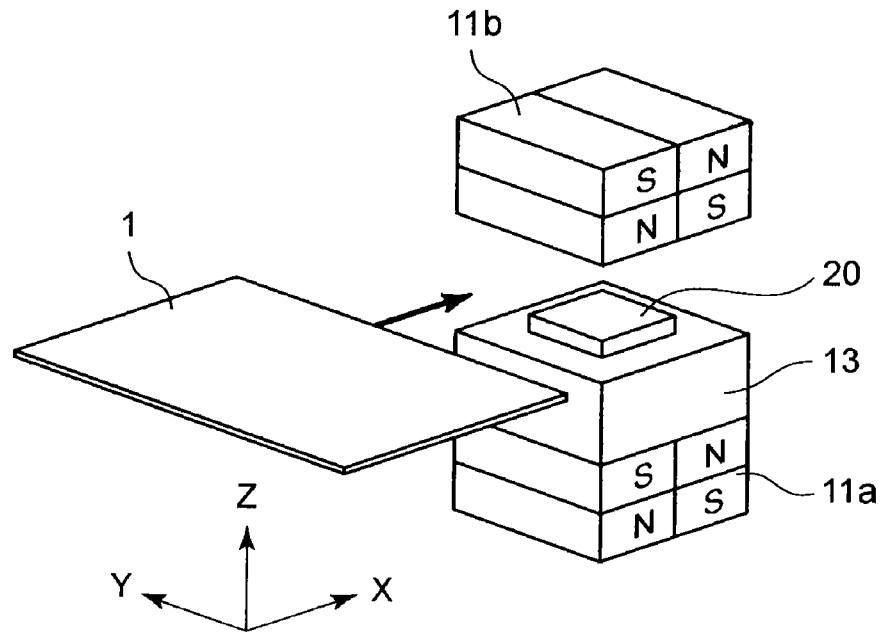
FIG. 13 is a perspective view showing Embodiment 5 of the present invention.
Figure 14:
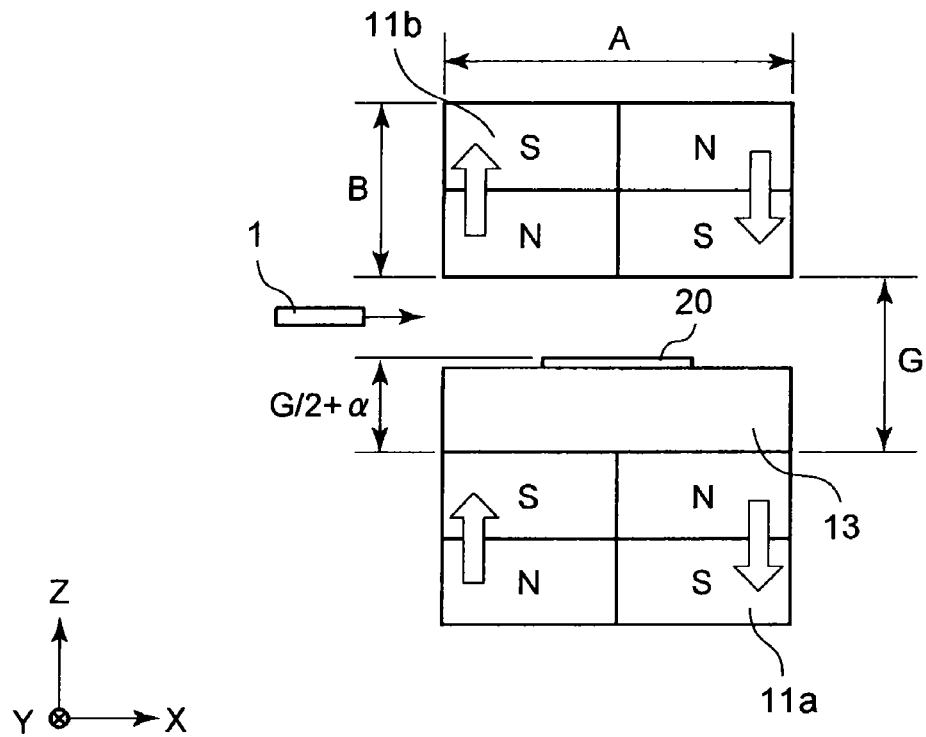
FIG. 14 is a side view showing Embodiment 5 of the present invention.

FIG. 13 is a perspective view showing Embodiment 5 of the present invention, and FIG. 14 is a side view thereof. A magnetic substance detection device includes a lower magnet 11a, an upper magnet 11b, a spacer 13, and a magnetoresistive sensor 20. This whole device is similar in configuration to Embodiment 1, but magnetization directions of the magnets 11a and 11b according to this embodiment are different.

The lower magnet 11a and the upper magnet 11b are arranged in opposition to each other above and below the movement path of the magnetic substance 1, while maintaining a certain interval of a gap G. The lower magnets 11a has a magnetization pattern called both-face four-pole magnetization, and it is magnetized such that in an opposed surface, a south pole and a north pole are arrayed in this order along X-direction, and in a back surface thereof, a north pole and a south pole are arrayed in this order along X-direction. Similarly, the upper magnet 11b has the magnetization pattern called both-face four-pole magnetization, and it is magnetized such that in an opposed surface, a north pole and a south pole are arrayed in this order along X-direction, and in a back surface thereof, a south pole and a north pole are arrayed in this order along X-direction. The south pole in the opposed surface of the lower magnet 11a and the north pole in the opposed surface of the upper magnet 11b are opposed to each other, and the north pole of the opposed surface of the lower magnet 11a and the south pole of the opposed surface of the upper magnet 11b are opposed to each other.

In the above-described arrangement as well, similar to Embodiment 1, in both the opposed surfaces, there is formed bias magnetic field distribution having magnetic lines extending from the two north poles located at one pair of diagonal corners to the two south poles located at the other pair of diagonal corners. In this case, around an intermediate portion of the four magnetic poles, a point where the magnetic field becomes zero exists, so that a strong magnetic field gradient can be created in a periphery of this zero point.

Figure 15:
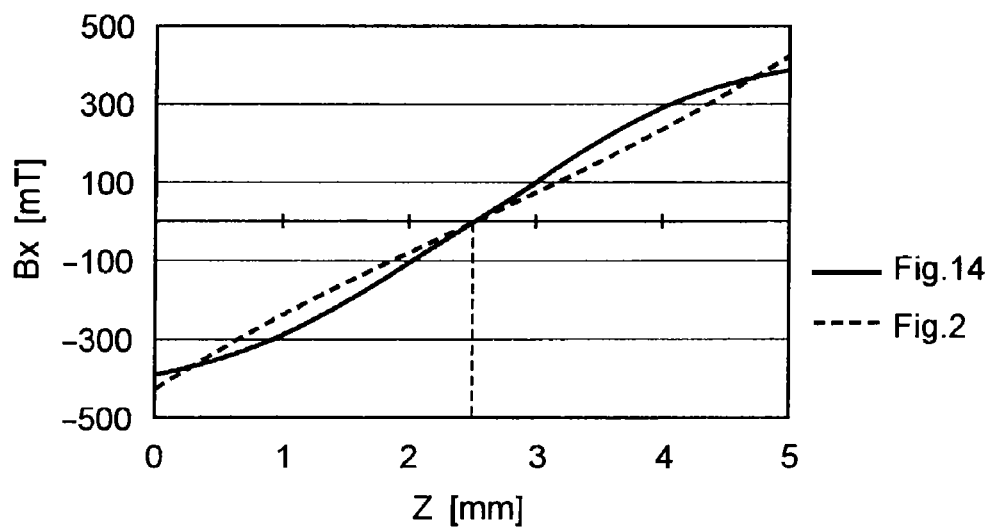
FIG. 15 is a graph in which the X component Bx of the magnetic field is plotted along Z-axis direction passing the magnetic field zero point.

FIG. 15 is a graph in which the X component Bx of the magnetic field is plotted along Z-axis direction passing the magnetic field zero point. The bias magnetic field distribution formed by the magnets 11a and 11b was calculated using two-dimensional simulation. The horizontal axis indicates a Z-direction distance measured from the opposed surface of the lower magnet 11a, and the vertical axis indicates the X component Bx of the generated magnetic field.

The solid line indicates the magnetic field distribution created by the magnetic pole arrangement according to this embodiment, and the dashed line indicates for comparison the magnetic field distribution (FIG. 5) created by the magnetic pole arrangement of Embodiment 1. Dimensions of the magnets 11a and 11b are A=10 mm, B=5 mm, and G=5 mm as described in Embodiment 1, and as for material, general neodymium sintered magnets are used.

Comparing the solid line and the dashed line, it is found that although they are common in that the magnetic field Bx becomes zero at the middle point (Z=2.5 mm) of both the magnets, the solid line tends to draw an S-curve, and the magnetic field gradient around the magnetic field zero point is larger than the gradient indicated by the dashed line. This is attributed to the fact that since the magnetization direction of each of the magnets exists not only in X-direction but also in Z-direction, a magnetic line loop extends far in Z-direction. As a result, the Bx component in the vicinity of the opposed surfaces of the magnets is smaller than that of Embodiment 1, while the Bx component at a point distant from the magnets is larger than that of Embodiment 1.

In this embodiment, for example, when the magnetic substance 1 passes through in a vicinity of Z=3 mm, the applied magnetic field to the magnetic substance 1 shows Bx=about 100 mT from the graph in FIG. 15. On the other hand, when the magnetic substance 1 passes through in a vicinity of Z=4 mm, the applied magnetic field to the magnetic substance 1 shows Bx=about 340 mT, thereby applying the larger magnetic field than that of Embodiment 1 to the magnetic substance 1.

Moreover, in this embodiment, since the magnetic field gradient around the magnetic field zero point is larger than that of Embodiment 3, assembling accuracy of the magnetoresistive sensor 20 becomes somewhat stricter. However, in the case where the passing area of the magnetic substance 1 is set to be relatively close to the magnetoresistive sensor 20, this embodiment is preferable in that the larger magnetic field can be applied to the magnetic substance.

Moreover, in this embodiment, similar to Embodiment 1, by creating a strong magnetic field gradient in the periphery of a magnetic field zero point, the strength of the magnetic field applied to the magnetoresistive sensor 20 can be adjusted, and the desired bias magnetic field can be set in accordance with the characteristics of the magnetoresistive sensor used. Furthermore, even if the distance between the magnetic substance 1 and the magnetoresistive sensor 20 fluctuates, the stable output signal can be obtained, thereby realizing highly-sensitive non-contact magnetic substance detection.

Further, in this embodiment as well, magnetic yokes can be attached to both side surfaces of the upper and lower magnets 11a and 11b as described in Embodiment 3. This allows the output signal to be further stabilized when the magnetic substance distance fluctuates, thereby realizing highly-sensitive non-contact magnetic substance detection. Furthermore, reduction in cost and enhancement in quality by alleviation of assembling accuracy by increase of an offset position α of the magnetoresistive sensors 20 can be achieved.

Embodiment 6

Figure 16:
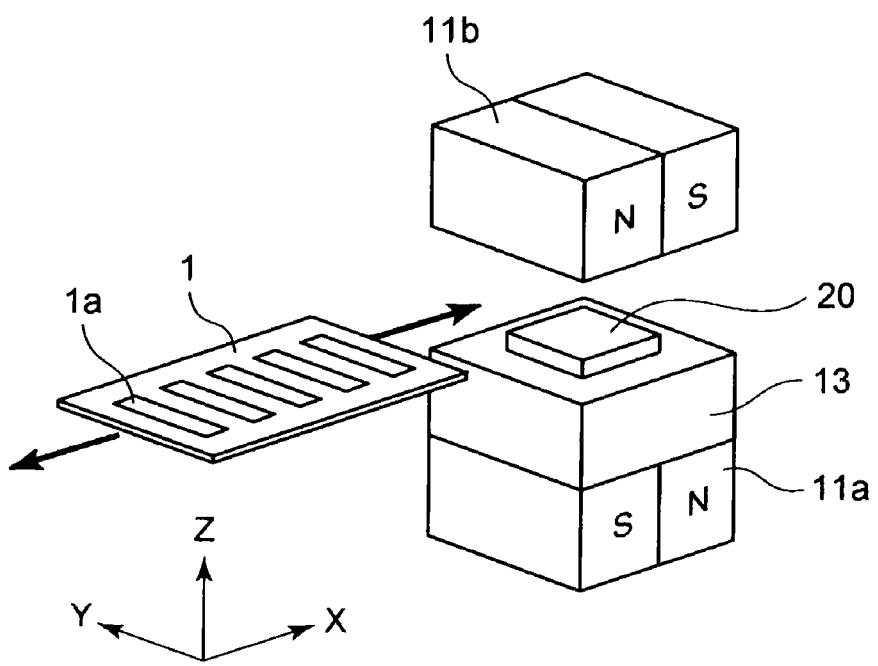
FIG. 16 is a perspective view showing Embodiment 6 of the present invention.
Figure 17:
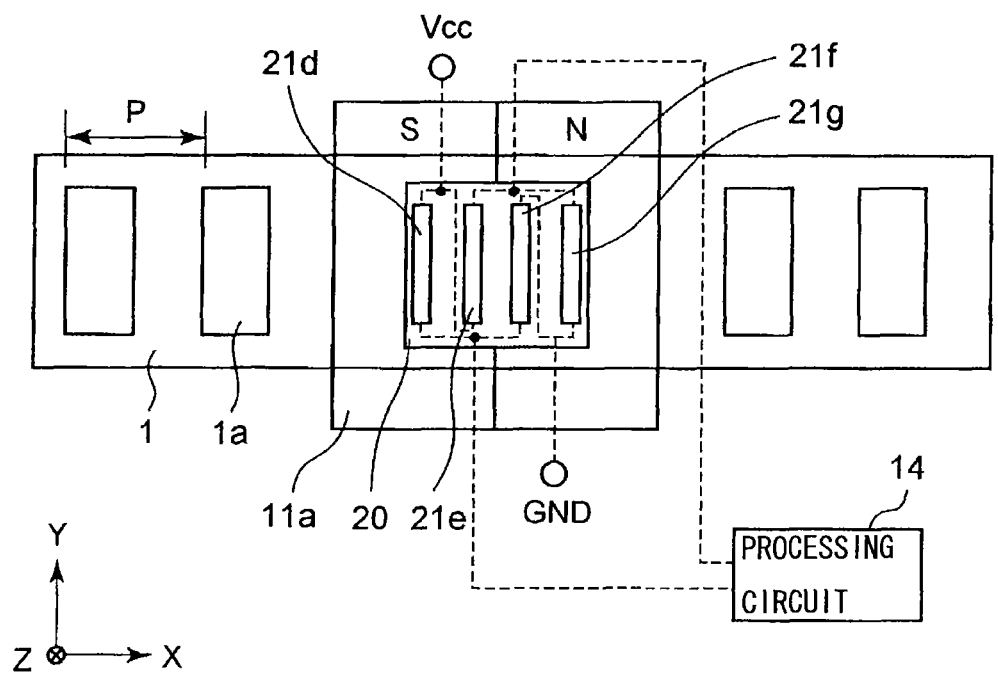
FIG. 17 is a plan view showing Embodiment 6 of the present invention.

FIG. 16 is a perspective view showing Embodiment 6 of the present invention, and FIG. 17 is a plan view thereof as seen downward from the movement path of the magnetic substance. This whole device is similar in configuration to Embodiment 1, and the magnetoresistive substance detection device includes the lower magnet 11a, the upper magnet 11b, the spacer 13, and the magnetoresistive sensor 20, as shown in FIG. 1.

In this embodiment the arrangement of the magnets 11a and 11b and magnetic field distribution formed by this arrangement are similar to those in Embodiment 1, but for the magnetic substance 1 to be detected, a magnetic scale in which a number of slit-like through-holes 1a are formed in a magnetic plate with a predetermined pitch is employed.

The magnetic scale is attached to, for example, a driving portion of a linear motion device, such as a working machine, to move integrally therewith, and an entire length of the magnetic scale is defined in accordance with a stroke of the linear motion device. Moreover, the through-holes 1a are formed with the certain pitch P. A change of the magnetic field caused by the presence or absence of the through holes 1a can be detected by the magnetoresistive sensor 20, and the output signal thereof is counted so that a movement amount of the magnetic scale, that is, a driving amount of the linear motion device can be measured.

Here, a case where the magnetoresistive sensor 20 is made of four AMR elements 21d to 21g is exemplified. Alternatively, it may be made up of semiconductor magnetoresistive (SMR) elements, giant magnetoresistive (GMR) elements, tunnel magnetoresistive (TMR) elements or the like. Please note that in FIG. 17, in order to illustrate an arrangement of the elements 21d to 21g, illustration of some of the through-holes is omitted.

The AMR elements 21d to 21g are formed to be a thin film pattern of a ferromagnetic substance formed on a substrate. When they are each formed in an elongated strip shape as illustrated, a direction which is perpendicular to the longitudinal direction thereof and parallel to the principal surface of the substrate is a magnetosensitive direction. The magnetosensitive direction of the AMR elements 21d to 21g is set to be parallel to the movement direction (X-direction) of the magnetic substance 1, and thus the resistance value of each of the elements can change in accordance with a change of the a magnetic field Bx in X-direction.

The AMR elements 21d and 21f are arranged at a interval of P/2, and are connected in series between a power supply line Vcc and a ground line GND to build up a first half bridge circuit. Similarly, the AMR elements 21e and 21g are arranged at a interval of P/2, and are connected in series between the power supply line Vcc and the ground line GND to build up a second half bridge circuit. Moreover, in order to determine the movement direction of the magnetic substance 1, the interval between the AMR element 21d and the AMR element 21e is set to P/4. The midpoint potential of each of the half bridge circuits is supplied as an output signal to the subsequent processing circuit 14 in which the output signal is subjected to amplification and various types of signal processing.

The magnetic substance 1 is fixed using a jig or the like so that the Z-position is kept constant even when the magnetic substance 1 moves forward and backward. When the Z-position is close to the magnetoresistive sensor 20, the output signal from the midpoint potential changes in a rectangular pulse shape during movement of the magnetic substance 1, and thus, the pulse output is counted by the processing circuit 14 so that the movement amount and the movement direction of the scale are measured.

On the other hand, when the Z-position of the magnetic substance 1 is far from the magnetoresistive sensor 20, the output signal from the midpoint potential changes in a sinusoidal shape during movement of the magnetic substance 1. In this case the output signal of the first half bridge circuit shows a sine wave output, while the output signal of the second half bridge circuit shows a cosine wave output having a phase shift of 90 degrees. Consequently, the movement amount of the scale can be measured with a high resolution by calculating an arctangent of the sine wave output and the cosine wave output.

Further, in this embodiment as well, magnetic yokes can be attached to both side surfaces of the upper and lower magnets 11a and 11b as described in Embodiment 3. This allows the output signal to be further stabilized when the magnetic substance distance fluctuates, thereby realizing highly-sensitive non-contact magnetic substance detection. Furthermore, reduction in cost and enhancement in quality by alleviation of assembling accuracy by increase of an offset position α of the magnetoresistive sensor 20 can be achieved.

In this embodiment, the configuration in which the magnetic scale moves together with the drive portion of the linear motion device is exemplified. Alternatively, another configuration can be also employed such that while the magnetic scale stands still, the magnetic substance detection device can move in X-direction together with the drive portion of the linear motion device.

Moreover, in this embodiment, although the example in which the magnetization directions of the magnets 11a and 11b are similar to those of Embodiment 1 is described, the magnetization directions as described in Embodiment 3 may be employed. Moreover, the arrangement of the AMR elements 21d to 21g constituting the magnetoresistive sensor 20 is not limited to that as described here, but any arrangement or elements may be employed, as long as the change of the magnetic field caused by the presence or absence of the through-holes of the magnetic scale can be detected.

Further, in this embodiment, an increment type encoder in which a number of through-holes are arrayed with a predetermined pitch is exemplified, but an absolute type encoder including an absolute value track to detect an absolute position of the scale may be employed.

Moreover, in this embodiment, a linear encoder in which the magnetic scale moves linearly is exemplified, but a rotary encoder in which the magnetic scale is rotationally displaced may be employed.

Moreover, in this embodiment, the magnetic scale in which a number of slit-like through-holes 1a are formed with a predetermined pitch in the magnetic plate is exemplified, but the magnetic scale according to this embodiment is not limited to this configuration, and magnetic portions and non-magnetic portions may be arrayed with a predetermined pitch. For example, a configuration may be employed in which slits 1a of a magnetic substance are provided on a non-magnetic plate 1 using, e.g., printing, deposition, plating and the like.

Embodiment 7

Figure 18:
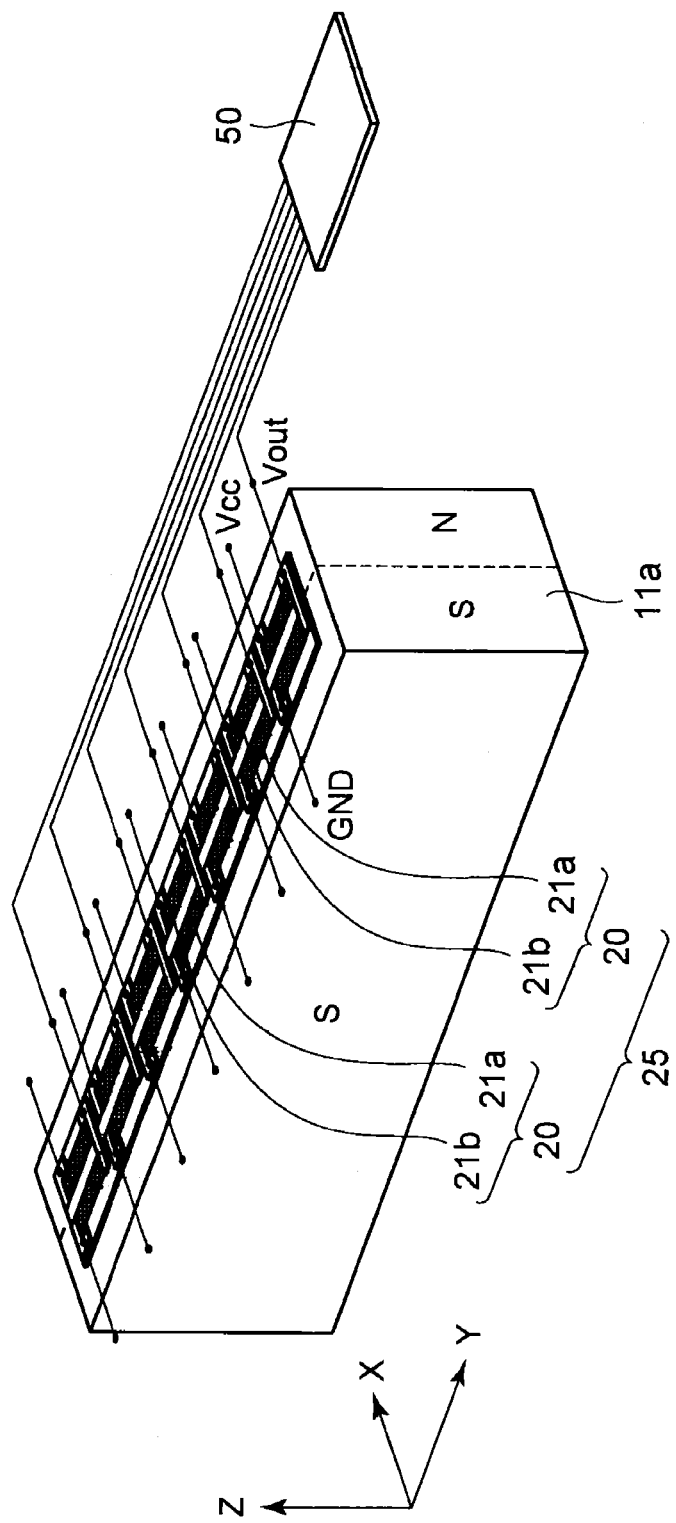
FIG. 18 is a perspective view showing Embodiment 7 of the present invention.
Figure 19:
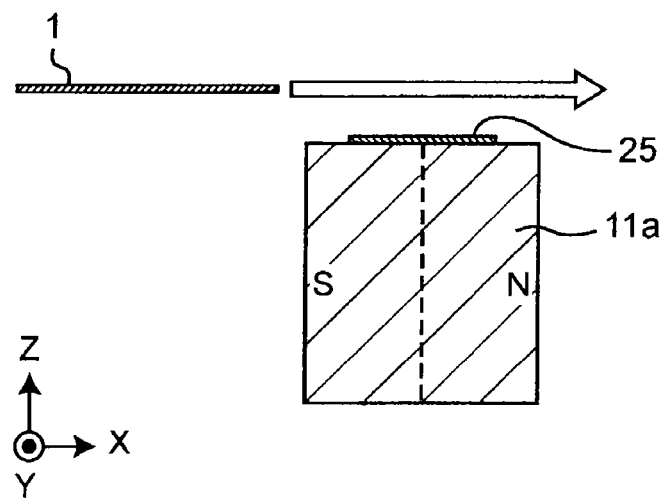
FIG. 19 is a side view showing Embodiment 7 of the present invention.

FIG. 18 is a perspective view showing Embodiment 7 of the present invention, and FIG. 19 is a side view thereof. A magnetic image detection device includes a magnetic image sensor 25, a lower magnet 11a for bias, a processing circuit 50 and the like. For easy understanding, a movement direction of a magnetic substance 1 to be detected is defined as X-direction, a direction perpendicular to the movement direction of the magnetic substance 1 is defined as Y-direction, and a direction perpendicular to both X-direction and Y-direction is defined as Z-direction.

The magnetic image sensor 25 is provided with a plurality of magnetoresistive sensors 20 arrayed linearly. Output signals from the respective magnetoresistive sensors 20 are simultaneously or chronologically supplied to the processing circuit 50 so as to be stored therein as a one-dimensional image signal. The above reading operation is performed every time the magnetic substance 1 moves with a predetermined pitch, thereby capturing magnetic distribution, that is, a two-dimensional magnetic pattern image of the magnetic substance 1. In this case an array direction of the magnetoresistive sensors 20 is defined as a main scanning direction (Y-direction), and the movement direction of the magnetic substance 1 is defined as a sub-scanning direction (X-direction).

Each of the magnetoresistive sensors 20 is made of two anisotropic magnetoresistive (AMR) elements 21a and 21b. The AMR elements 21a and 21b are formed to be a thin film pattern of a ferromagnetic substance on a substrate. When they are each formed in an elongated strip shape as illustrated, a direction which is perpendicular to the longitudinal direction thereof and parallel to the principal surface of the substrate is a magnetosensitive direction. In this embodiment, the magnetosensitive direction of the AMR elements 21a and 21b is set to be parallel to the movement direction of the magnetic substance 1 (X-direction), and thus the resistance value of each of the elements can change in accordance with a change of the magnetic field Bx in X-direction.

The AMR elements 21a and 21b are connected in series between a power supply line Vcc and a ground line GND to build up a half bridge circuit. The midpoint potential thereof is supplied as an output signal to the subsequent processing circuit 50 in which the output signal is subjected to amplification and various types of signal processing.

As the magnetoresistive elements, in addition to the anisotropic magnetoresistive (AMR) elements, giant magnetoresistive (GMR) elements, tunnel magnetoresistive (TMR) elements and the like can be used.

In this embodiment, exemplified is a case where as the magnetoresistive sensors 20, the half bridge circuit including the two AMR elements 21a and 21b is mounted on a single substrate and the plural substrates are arranged linearly. Alternatively, the plurality of half bridge circuits may be integrated on a single substrate, thereby reducing the mounting cost.

The lower magnet 11a has a function of generating a magnetic field component parallel to the movement direction of the magnetic substance 1. The lower magnet 11a is constructed as a prism-shaped magnet, and as to a magnetization direction, the lower magnet 11a is magnetized so that a south pole and a north pole are arrayed in this order along X-direction in the surface opposite to the magnetic image sensor 25. This can form bias magnetic field distribution having magnetic lines extending from the north pole to the south pole, so that a magnetic field parallel to X-direction is formed in a perpendicular YZ surface passing a center of the lower magnet 11a. By positioning the magnetic image sensor 25 in this YZ surface, the bias magnetic field in X-direction is applied to the magnetoresistive sensors 20. Incidentally, in the lower magnet 11a there may be arrangement of the poles reverse to the foregoing, that is, the north pole and the south pole may be arrayed in this order along X-direction.

Figure 20:
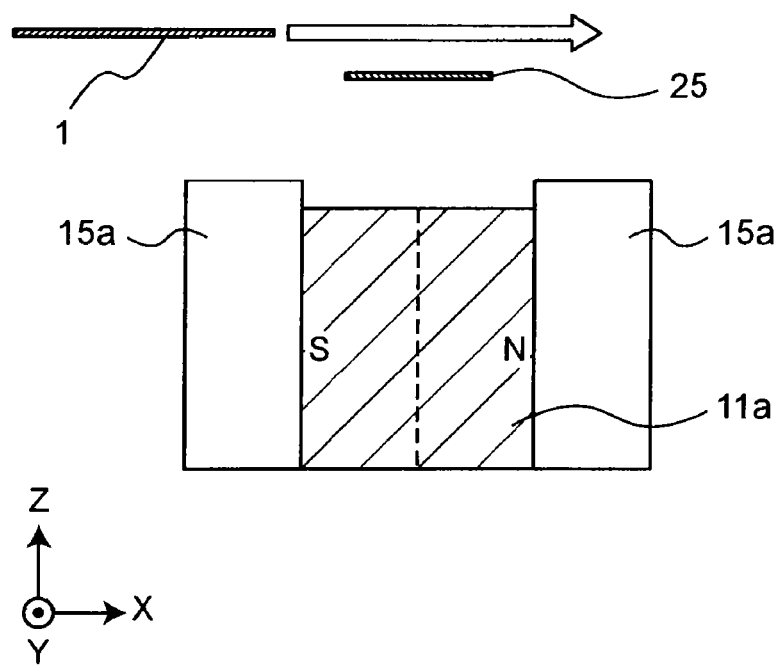
FIG. 20 is a side view showing an example in which lower yokes are attached to a lower magnet.

FIG. 20 is a side view showing an example in which lower yokes 15a are attached to the lower magnet 11a. In this manner, the lower yokes 15a each made of a soft magnetic substance may be attached to both side surfaces of the lower magnet 11a, i.e., an upstream side surface and a downstream side surface along X-direction in which the magnetic body 1 moves. In this case, by adjusting dimensions of the lower yokes 15a (e.g., a yoke thickness, a projection amount from the bias magnet and the like), a magnetic field component parallel to the movement direction of the magnetic substance 1 can be set more precisely. In this embodiment, since the lower magnet 11a has a shape elongated in Y-axis direction, it is difficult to keep uniformity of the magnet, thereby causing a possibility that variation occurs among output terminals. However, by attaching the lower yokes 15a to both the side surfaces of the lower magnets 11a, stable magnetic field distribution can be formed regardless of the magnetic force variation of the magnet. As a result, reduction in cost and enhancement in quality due to an increase in yield ratio of each of the magnets can be achieved.

The magnetic image sensors 25 may be located directly on an upper surface of the lower magnet 11a, or may be located by the intermediary of a plate-like spacer made of a non-magnetic material. In this case, the magnitude of the bias magnetic field applied to the magnetoresistive sensors 20 can be precisely set up by adjusting the thickness of the spacer.

The magnetic substance 1 is conveyed by a well-known conveyance mechanism (not shown) to move in X-direction while it is in contact with the upper surface of the magnetic image sensor 25, or it is kept at a predetermined distance from the upper surface.

Figure 21A:
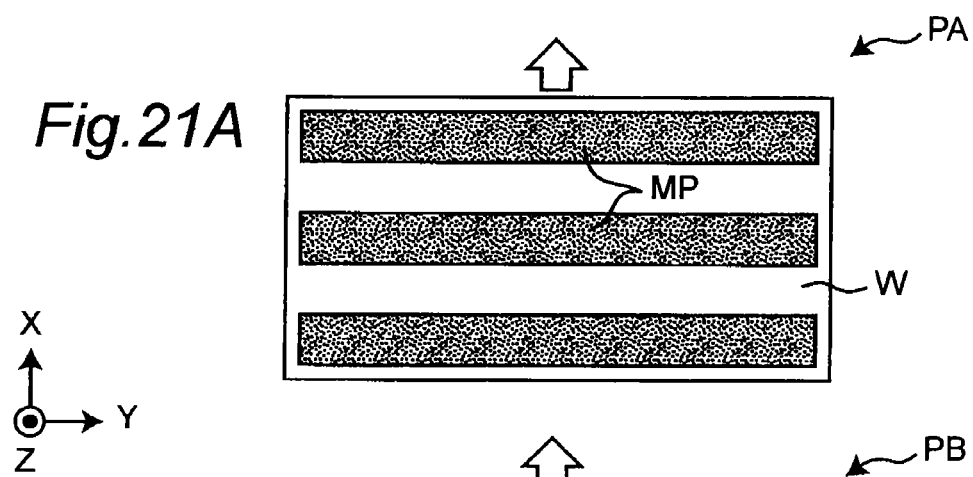
FIGS. 21A and 21B are plan views showing various examples of a magnetic pattern of a magnetic substance, FIG. 21A showing one example of a lateral stripe magnetic pattern, and FIG. 21B showing one example of a longitudinal stripe magnetic pattern.
Figure 21B:
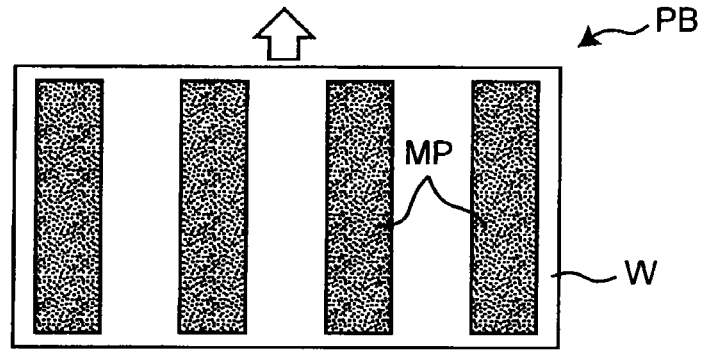

FIGS. 21A and 21B are plan views showing various examples of a magnetic pattern of the magnetic substance 1, FIG. 21A showing one example of a lateral stripe magnetic pattern, and FIG. 21B showing one example of a longitudinal stripe magnetic pattern. In the lateral stripe magnetic pattern PA shown in FIG. 21A, rectangular magnetic patterns MP elongated in Y-direction are periodically arrayed along X-direction. On the other hand, in the longitudinal stripe magnetic pattern PB shown in FIG. 21B, the magnetic patterns MP elongated in X-direction are periodically arrayed along Y-direction.

In the magnetic reading, when the lateral stripe magnetic pattern PA moves in X-direction and the specific magnetic pattern MP approaches the upstream AMR elements 21a, the magnetic field Bx around the AMR elements 21a changes, while the magnetic field Bx around the downstream AMR elements 21b does not change, and thus only the resistance value of each of the AMR elements 21a is changed, and the midpoint potential is also changed. Subsequently, when the magnetic pattern MP further moves in X-direction and approaches the downstream AMR elements 21b, the magnetic field Bx around the AMR elements 21b also comes to change, and thus the resistance values of the both elements are changed, so that the midpoint potential returns to the same potential as that when the magnetic substance is absent. Subsequently, when the magnetic pattern further moves in X-direction, only the resistance value of each of the downstream AMR elements 21b is changed, and at this time the midpoint potential is changed in a reverse direction to the foregoing. Subsequently, the magnetic pattern MP moves away from the AMR elements 21b, the midpoint potential returns to the same potential as that when the magnetic substance is absent.

Figure 22:
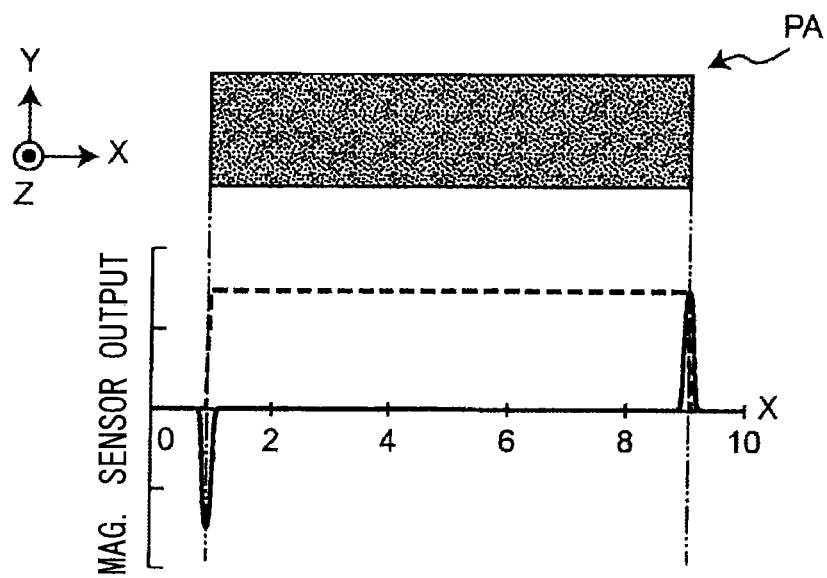
FIG. 22 is an explanatory diagram showing a relationship between a reading position of the magnetic pattern and a midpoint potential output of a magnetoresistive sensor.

FIG. 22 is an explanatory diagram showing a relationship between a reading position of the magnetic pattern and the midpoint potential output of each of the magnetoresistive sensors 20. As indicated by the solid line in FIG. 22, the midpoint potential of the half bridge circuit is changed in the following sequence of a steady-state value→a negative pulse→a steady-state value→a positive pulse→a steady-state value. This operation corresponds to detection of an X-direction edge of the magnetic pattern MP.

On the other hand, when the longitudinal stripe magnetic pattern PB as shown in FIG. 21B is read, the magnetoresistive sensor 20 located in an area through which the magnetic pattern MP passes outputs a signal indicated by the solid line in FIG. 22, while the magnetoresistive sensor 20 located outside the passing area of the magnetic pattern MP outputs only the steady-state value, hence the edge detection pulse does not appear.

The processing circuit 50 processes the output signal from each of the magnetoresistive sensors 20 to analyze the presence or absence of the edge detection pulse and a pulse position thereof, thereby reproducing a two-dimensional image of the magnetic patterns MP.

Figure 23:
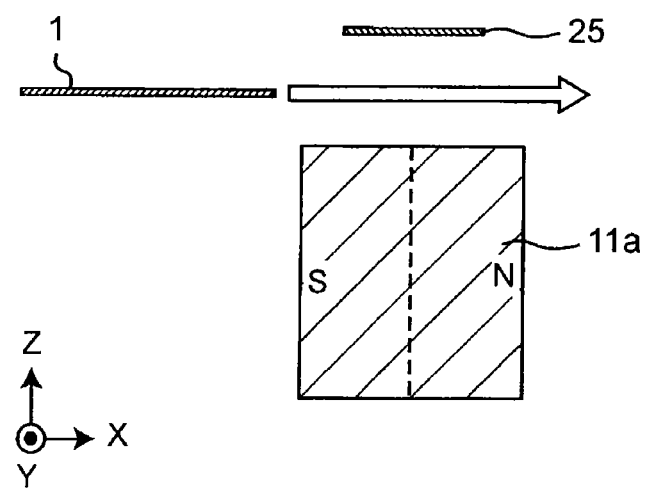
FIG. 23 is a side view showing another example of arrangement of a magnetic image sensor.
Figure 24:
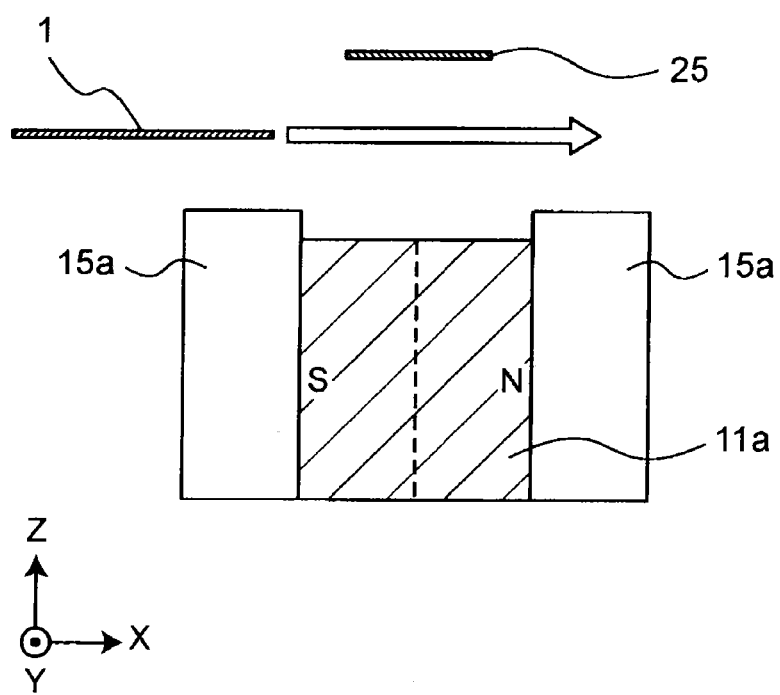
FIG. 24 is a side view showing another example in which the lower yokes are attached to both side surfaces of the lower magnet.

FIG. 23 is a side view showing another example of arrangement of the magnetic image sensor 25. Here, a configuration is employed such that the upper and lower surfaces of the magnetic image sensor 25 are inverted and a space is secured between the magnetic image sensor 25 and the lower magnet 11a so that the magnetic substance 1 can pass therebetween. The above-described configuration also enables the magnetic reading as described in FIG. 19. Moreover, FIG. 24 is a side view showing an example in which the lower yokes 15a are attached to both side surfaces of the lower magnet 11a in the configuration shown in FIG. 23 in a manner similar to FIG. 20. The above-described installation of the lower yokes 15a can form stable magnetic field distribution.

Figure 25:
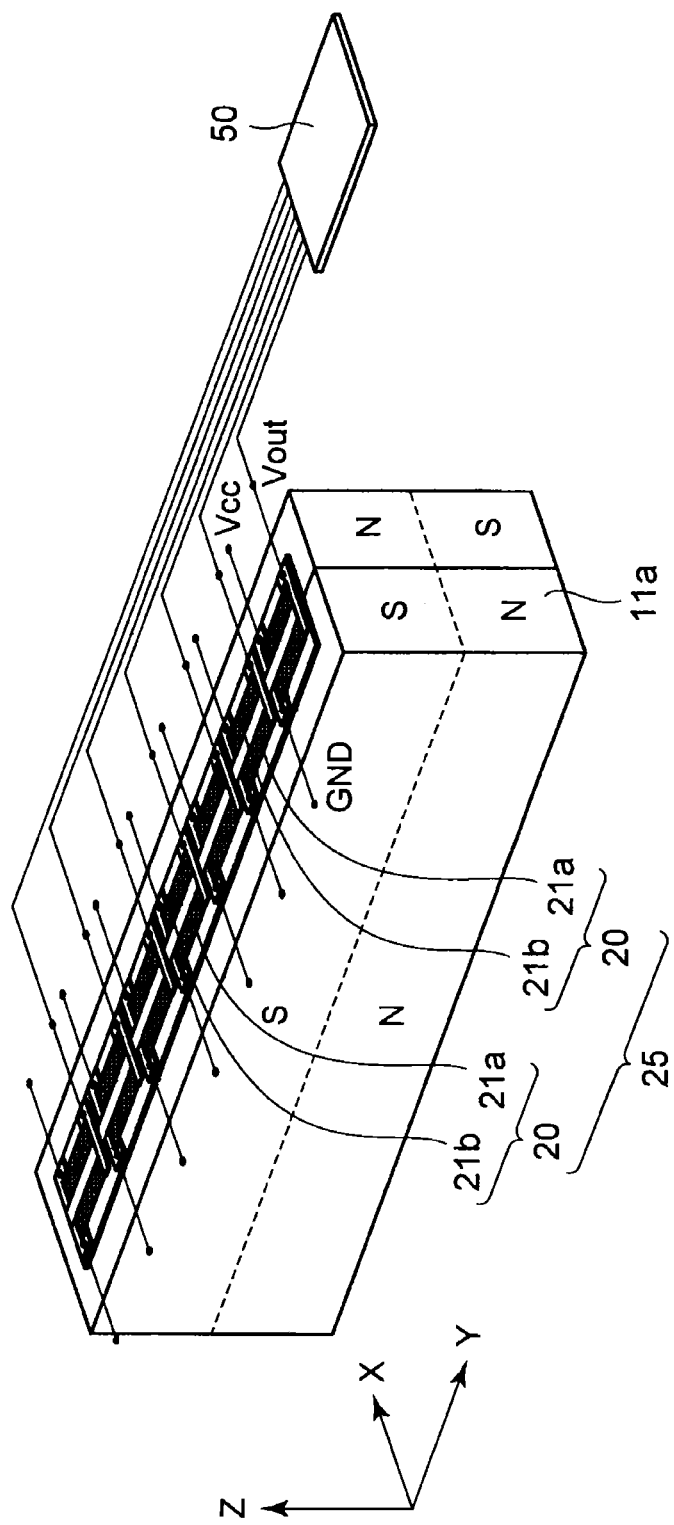
FIG. 25 is a perspective view showing another example of magnetic pole arrangement of the lower magnet.

FIG. 25 is a perspective view showing another example of magnetic pole arrangement of the lower magnet 11a. The lower magnet 11a is constructed as a prism-shaped magnet having a magnetization pattern called both-face four-pole magnetization, and it is magnetized such that in an opposed surface to the magnetic image sensor 25, a south pole and a north pole are arrayed in this order along X-direction, and in a back surface thereof, a north pole and a south pole are arrayed in this order along X-direction.

In the above-described magnetic pole arrangement, since as to the magnetization direction of the magnet, there exist not only the component in X-direction but also the component in Z-direction, magnetic line loops extend far in Z-direction, thereby enlarging a detection area of the magnetic image sensor 25.

Figure 26:
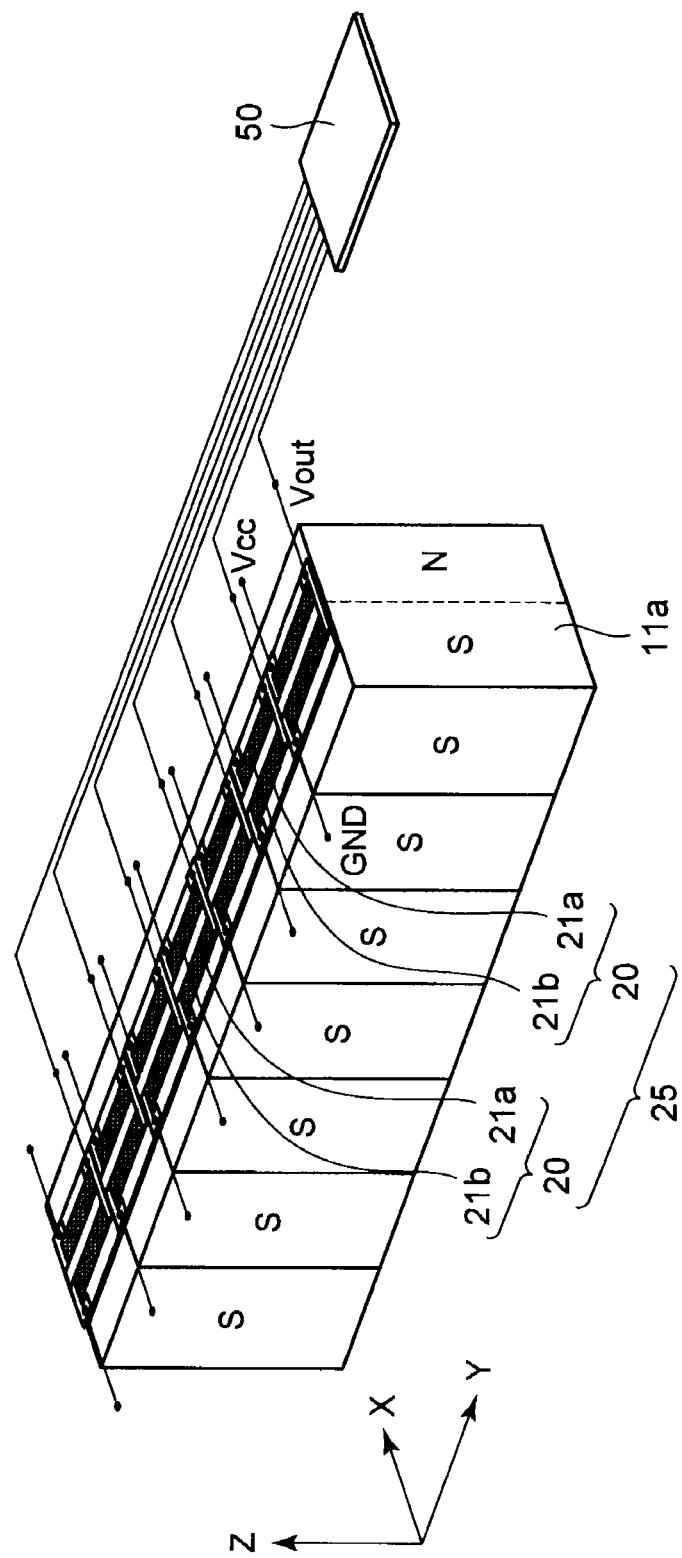
FIG. 26 is a perspective view showing still another example of the magnetic pole arrangement of the lower magnet.

FIG. 26 is a perspective view showing still another example of magnetic pole arrangement of the lower magnet 11a. The lower magnet 11a is divided into a plurality of magnetic poles along the array direction of the magnetoresistive sensors 20, and for example, a number of unit magnets each having a south pole and a north pole are arrayed so that the same poles are adjacent to one another. In this configuration, the size of the individual magnet can be made small, thereby reducing cost of the whole magnet.

Figure 27:
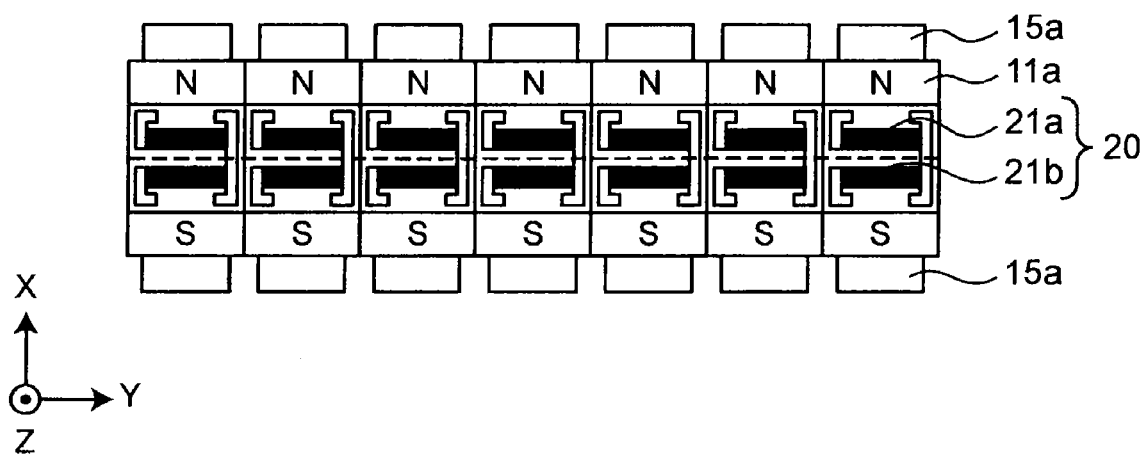
FIG. 27 is a plan view when the lower yoke is attached to each of the magnetic poles on both side surfaces of the lower magnet in the configuration of FIG. 26.

FIG. 27 is a plan view when the lower yoke 15a is attached to each of the magnetic poles on both the side surfaces of the lower magnet 11a in the configuration of FIG. 26. In this configuration, the plurality of lower yokes 15a are prepared, or attachment positions of the lower yokes 15a are displaced in each of the magnetic poles, so that variation of the respective magnetic poles can be adjusted by using the lower yokes 15a to precisely set up the bias magnetic field. Alternatively, the lower yokes 15a may be arranged in close contact with one another without forming any gap between the respective adjacent lower yokes 15a. Moreover, the single lower yoke 15a may be attached to the plurality of poles in continuous contact, and in this case, costs of the magnetic yokes and the assembling can be reduced.

Figure 28:
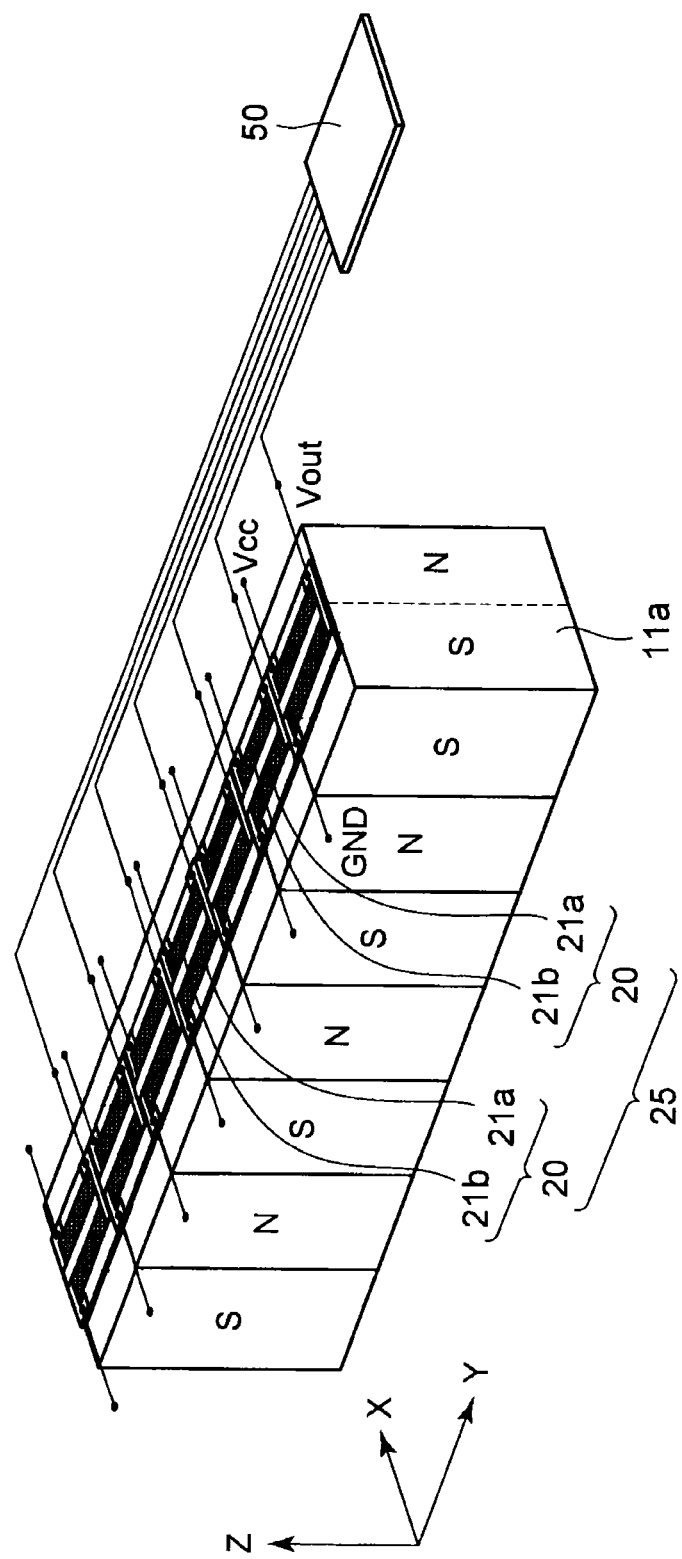
FIG. 28 is a perspective view showing still another example of the magnetic pole arrangement of the lower magnet.

FIG. 28 is a perspective view showing still another example of the magnetic pole arrangement of the lower magnet 11a. The lower magnet 11a is divided into a plurality of magnetic poles along the array direction of the magnetoresistive sensors 20, and for example, a number of unit magnets each having a south pole and a north pole are arrayed so that the different poles are adjacent to one another. In this configuration, since the size of the individual magnet can be made small, thereby reducing cost of the whole magnet.

Figure 29:
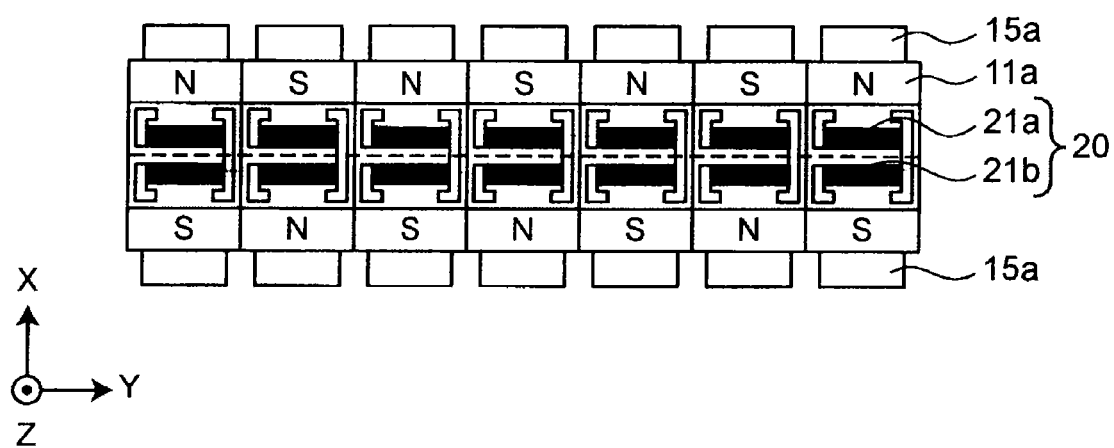
FIG. 29 is a plan view when the lower yoke is attached to each of the magnetic poles on both the side surfaces of the lower magnet in the configuration of FIG. 28.

FIG. 29 is a plan view when the lower yokes 15a are attached to each of the magnetic poles on both the side surfaces of the lower magnet 11a in the configuration shown in FIG. 28. In this configuration, the plurality of dimensions of the lower yokes 15a are prepared, or the attachment position of the lower yokes 15a are displaced in each of the magnetic poles, so that variation of the respective magnetic poles can be adjusted by using the magnetic yokes to precisely set up the bias magnetic field.

As described above, in this embodiment, as each of the magnetoresistive sensors 20, the AMR elements 21a, 21b having large resistance values per unit length can be used to thereby reduce a consumption current of the element itself even when the element is downsized. As a result, the magnetoresistive image sensor 25 having favorable temperature characteristics and high reliability can be realized. By using the above-described magnetic image sensor 25, image processing similar to image processing to an optical image that can be captured using an optical image sensor can be applied, so that higher-accuracy magnetic pattern reading can be realized.

Embodiment 8

Figure 30:
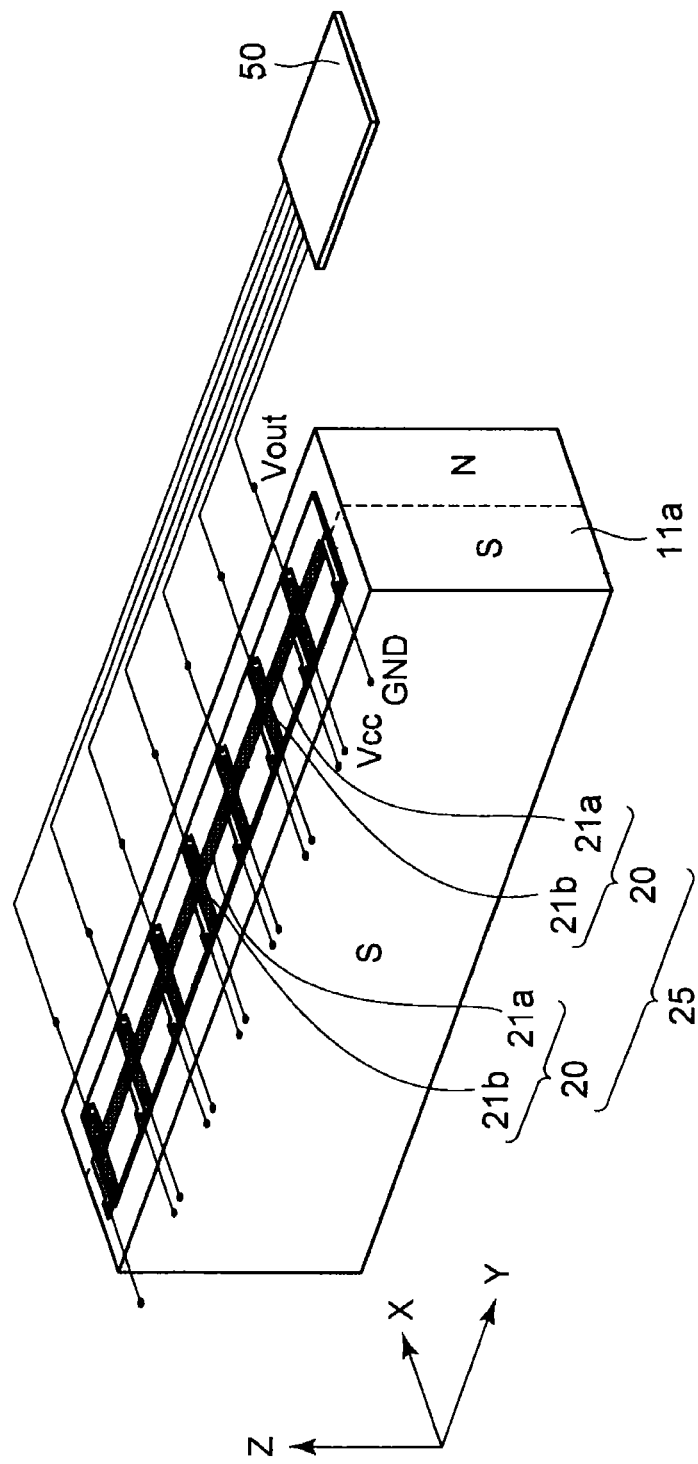
FIG. 30 is a perspective view showing Embodiment 8 of the present invention.
Figure 31:
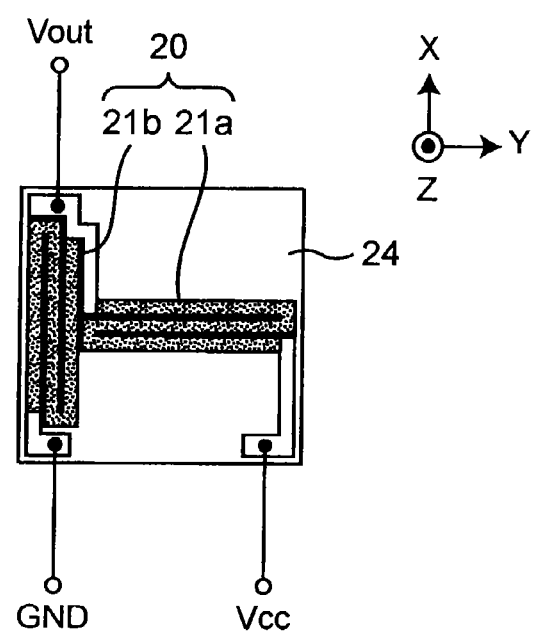
FIG. 31 is a plan view showing another configuration of a magnetoresistive sensor.

FIG. 30 is a perspective view showing Embodiment 8 of the present invention. FIG. 31 is a plan view showing another configuration of a magnetoresistive sensor 20. A magnetic image detection device includes the magnetic image sensor 25, the lower magnet 11a, and the processing circuit 50 as described in Embodiment 7.

This embodiment is different in arrangement of the AMR elements 21a and 21b from Embodiment 7. The AMR elements 21a and 21b are formed to be a thin film pattern of a ferromagnetic substance on a substrate 24. When they are each formed in an elongated strip shape as illustrated, a direction which is perpendicular to the longitudinal direction thereof and parallel to the principal surface of the substrate is a magnetosensitive direction.

As shown in FIG. 31, the magnetosensitive direction of the AMR element 21a is set to be parallel to the movement direction of the magnetic substance 1 (X-direction), and the resistance value of the element can change in accordance with a change of a magnetic field Bx in X-direction. On the other hand, the magnetosensitive direction of the AMR element 21b is set to be a direction perpendicular to the movement direction of the magnetic substance 1 (Y-direction), and is arranged so that the resistance value of the element does not change in accordance with the change of the magnetic field Bx. Incidentally, FIG. 31 exemplifies an example in which the AMR elements 21a and 21b are each formed in a folded shape to have higher sensitivity, but they may be each formed in a single strip.

The AMR elements 21a and 21b are connected in series between a power supply line Vcc and a ground line GND to build up a half bridge circuit. The midpoint potential thereof is supplied as an output signal to the subsequent processing circuit 50 in which the output signal is subjected to amplification and various types of signal processing.

According to the above-described element arrangement, when the bias magnetic field is applied in X-direction, the bias magnetic field Bx is applied to the AMR element 21a, while the bias magnetic field is not applied to the AMR element 21b, because the bias magnetic field is perpendicular to the magnetosensitive direction thereof. In this state, when the magnetic substance 1 moves in X-direction to approach the AMR element 21a, the magnetic field Bx around the AMR element 21a changes, so that the resistance value of the element is changed. On the other hand, when the magnetic substance approaches the AMR element 21b, even if the magnetic field Bx around the AMR element 21b changes, the change of the magnetic field cannot be detected and the resistance value of the AMR element 21b is constant. In this case, the midpoint potential is changed when the magnetic pattern is present above the magnetoresistive sensor 12, while the midpoint potential is not changed when the magnetic pattern is absent above the magnetoresistive sensor 12. That is, as for operation, edge detection of the magnetic substance as described in Embodiment 7 is not performed, but existence of the magnetic substance itself can be detected. For example, when a magnetic pattern as shown in FIG. 22 is detected, a signal as indicated by the dashed line of FIG. 22 can be obtained.

Figure 32A:
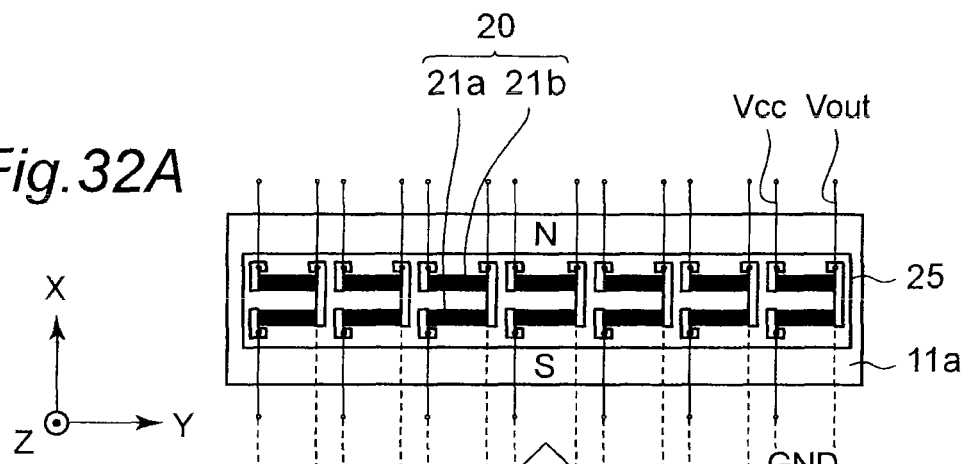
FIG. 32A is a plan view of a magnetic image sensor.
Figure 32B:
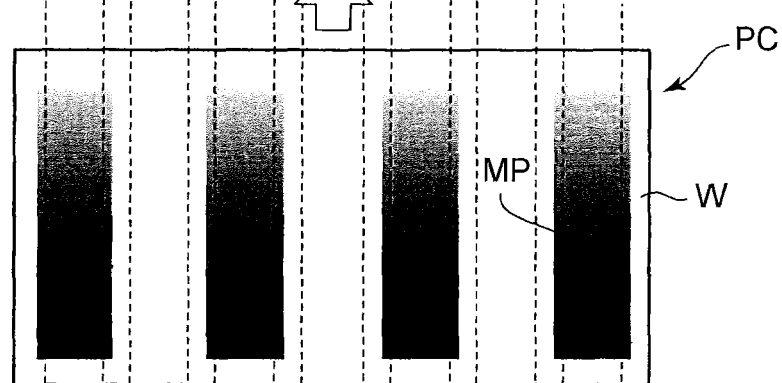
FIG. 32B shows one example of a gradation magnetic pattern.
Figure 32C:
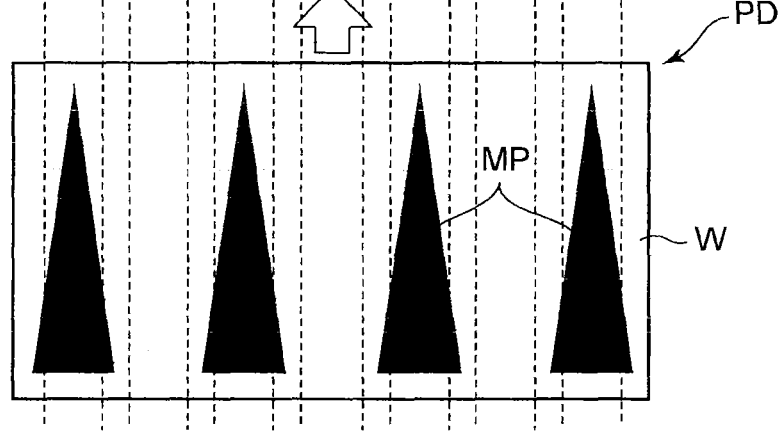
FIG. 32C shows one example of a triangle-shaped magnetic pattern.

FIG. 32A is a plan view of the magnetic image sensor 25, FIG. 32B shows one example of a gradation magnetic pattern, and FIG. 32C shows one example of a triangle-shaped magnetic pattern. As shown in FIG. 32A, the magnetic image sensor 25 in which a plurality of magnetoresistive sensors 20 are arrayed linearly is positioned on or above the upper surface of the lower magnet 11a. Here, an example is exemplified in which as shown in FIG. 18, each of the magnetoresistive sensors 20 is arranged so that the magnetosensitive directions of the AMR elements 21a and 21b are both set to X-direction, but as shown in FIG. 31, each of the magnetoresistive sensors 20 may be arranged so that the magnetosensitive direction of the AMR element 21a is set to X-direction, while the magnetosensitive direction of the AMR element 21b is set to Y-direction. The magnetic substance 1 moves in X-direction to pass by the magnetic image sensor 25.

In the gradation magnetic pattern PC as shown in FIG. 32B, rectangular magnetic patters MP elongated in X-direction are arrayed periodically along Y-direction, and in each of the magnetic patterns MP, strength of the magnetization increases almost linearly in −X direction. On the other hand, in the triangle-shaped magnetic pattern PD as shown in FIG. 32C, the triangle-shaped magnetic patterns MP elongated in X-direction are arrayed periodically along Y-direction.

Figure 33:
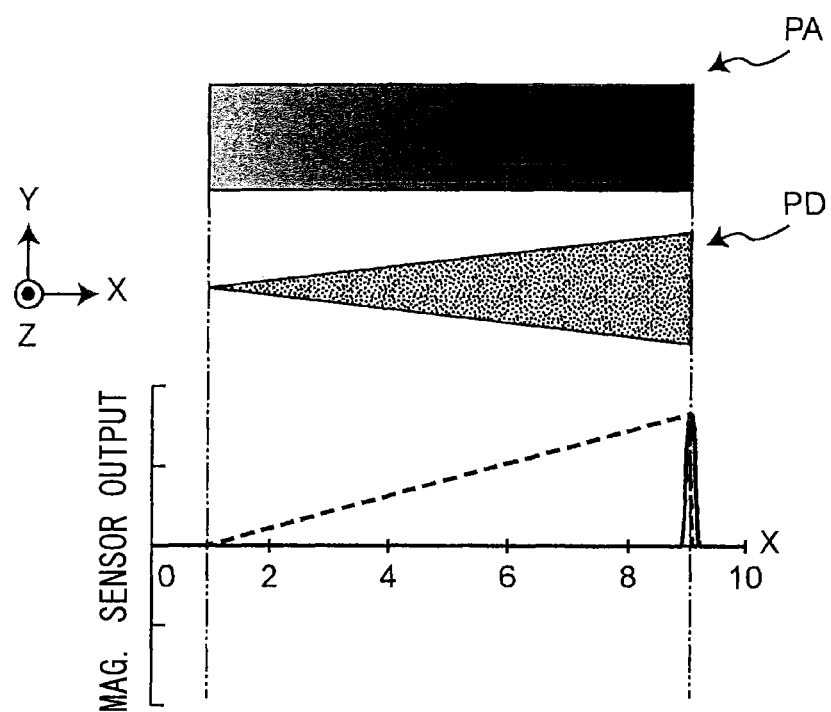
FIG. 33 is an explanatory diagram showing a relationship between a reading position of magnetic patterns and midpoint potential output of the magnetoresistive sensor.

FIG. 33 is an explanatory view showing a relationship between a reading position of the magnetic patterns and midpoint potential output of each of the magnetoresistive sensors 20. In the gradation magnetic pattern PC and the triangle-shape magnetic pattern PD, the strength of the magnetic field applied to the magnetoresistive sensor 20 gradually changes. Thus, when the magnetic reading is performed in the element pattern arrangement shown in FIG. 18, as indicated by the solid line of FIG. 33, the change of the midpoint potential of the half bridge circuit becomes small, and only a pulse signal can be obtained at a rear edge of the magnetic pattern. Accordingly, since detection sensitivity at a front edge of the magnetic pattern is small and the detection is vulnerable to exogenous noise, the detection of a magnetic pattern image is relatively unstable.

In contrast, when the magnetic reading is performed in the element pattern arrangement shown in FIG. 31, as indicated by the dashed line of FIG. 33, the midpoint potential of the half bridge circuit continuously changes in a manner almost proportional to the strength of the magnetic field applied to the magnetoresistive sensor 20, and returns to a steady-state value at the rear edge of the magnetic pattern. Accordingly, since the shape of the magnetic pattern and the strength of the magnetization can be detected as an analog signal, the detection is tolerant of the exogenous noise, thereby stably detecting the magnetic pattern image.

As to the arrangement of the magnetic image sensor 25 and the magnetic pole arrangement of the lower magnet 11a, the configuration similar to that of FIG. 18 is described here, but the configurations as shown in FIGS. 20, 23, 24, 25, 26, 27, 28 and 29 can also be employed.

As described above, in this embodiment, as the magnetoresistive sensor 20, the AMR elements 21a and 21b having the large resistance values per unit length are used, so that the magnetic image sensor 25 having favorable temperature characteristics and high reliability can be realized.

Moreover, by employing the element pattern arrangement for detecting existence of the magnetic substance itself, not edge of the magnetic substance, the magnetic pattern image can be stably detected in a manner tolerant of the exogenous noise.

Embodiment 9

Figure 34:
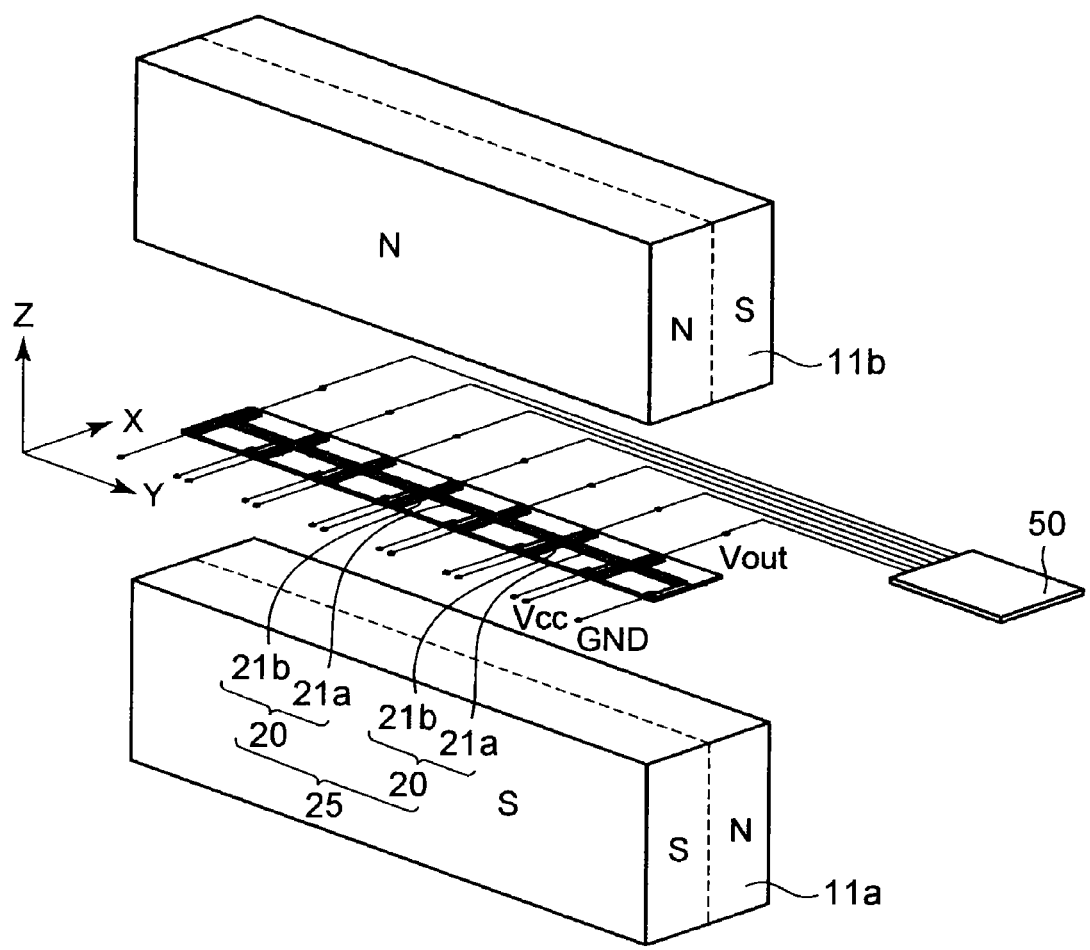
FIG. 34 is a perspective view showing Embodiment 9 of the present invention.

FIG. 34 is a perspective view showing Embodiment 9 of the present invention, and FIG. 35 is a side view thereof. As described in Embodiment 7, the magnetic image detection apparatus includes the magnetic image sensor 25, the lower magnet 11a, and the processing circuit 50, wherein an additional upper magnet for bias 11b is further provided to thereby enhance the magnetic field applied to the magnetic substance 1.

The magnets 11a and 11b are arranged in opposition to each other below and above the movement path of the magnetic substance 1, and are fixed to a housing (not shown) or the like to maintain a certain gap therebetween.

The magnetic image sensor 25 is arranged in the middle of the movement path of the magnetic substance 1 around an almost intermediate portion between opposed surfaces of the lower magnet 11a and the bias magnet 11b. In order to precisely position the magnetoresistive sensors 20, a plate-like spacer (not shown) may be interposed on the opposed surface of the lower magnet 11a. Here, an example is described in which as described in FIG. 30, each of the magnetoresistive sensors 20 is arranged so that the magnetosensitive direction of the AMR element 21a is set to X-direction, and the magnetosensitive direction of the AMR element 21b is set to Y-direction, but each of the magnetoresistive sensors 20 may be arranged so that the magnetosensitive directions of the AMR elements 21a and 21b are both set to X-direction, as shown in FIG. 18.

As to magnetization directions of the magnets, the lower magnet 11a is magnetized so that a south pole and a north pole are arrayed in this order along X-direction on the opposed surface thereof. On the other hand, the upper magnet 11b is magnetized so that a north pole and a south pole are arrayed in this order along X-direction on the opposed surface thereof. The south pole of the lower magnet 11a and the north pole of the bias magnet 11b are opposed to each other, and the north pole of the lower magnet 11a and the south pole of the bias magnet 11b are opposed to each other. Incidentally, arrangement of poles reverse to the foregoing, that is, arrangement in which in the lower magnet 11a, the north pole and the south pole are arrayed in this order, and in the bias magnet 11b, the south pole and the north pole are arrayed in this order may be employed.

In the above-described quadrupole arrangement, there is formed bias magnetic field distribution having magnetic lines extending from the two north poles located at diagonal corners to the two south poles located at the other diagonal corners, and the magnetic field component parallel to the movement direction of the magnetic substance 1 can be generated. In this case, around an intermediate portion of the four magnetic poles, a point where the magnetic field becomes zero exists, so that a strong magnetic field gradient can be created in a periphery of this zero point.

Thus, by adjusting the position of the magnetic image sensor 25, magnitude of the bias magnetic field can be easily set so as to prevent the magnetic saturation of the AMR elements 21a and 21b. Moreover, when the magnetic substance 1 passes between the magnets 11a and 11b, as the magnetic substance 1 is more distant from the zero point, the strength of the magnetic field applied to the magnetic substance 1 becomes larger. Thus, even if the distance between the magnetic substance 1 and the magnetic image sensor 25 fluctuates, the amount of change of the magnetic field is changed so as to compensate the distance fluctuation. As a result, an output signal of the magnetic image sensor 25 is stabilized, and the highly-sensitive non-contact magnetic substance detection is realized.

FIG. 37 is a side view showing another example of magnetization arrangement of the magnets 11a and 11b. The lower magnet 11a is magnetized so that the north pole and the south pole are arrayed in this order along X-direction on the opposed surface thereof. The upper magnet 11b is also magnetized so that the north pole and the south pole are arrayed in this order along X-direction on the opposed surface thereof. The north pole of the lower magnet 11a and the north pole of the upper magnet 11b are opposed to each other, and the south pole of the lower magnet 11a and the south pole of the upper magnet 11b are opposed to each other. Incidentally, arrangement of poles reverse to the foregoing, that is, arrangement in which in the lower magnet 11a, the south pole and the north pole are arrayed in this order, and in the upper magnet 11b, the south pole and the north pole are arrayed in this order may be employed.

The above-described magnetic pole arrangement also can form the magnetic field parallel to X-direction in a perpendicular YZ surface passing centers of the magnets 11a and 11b.

Figure 36:
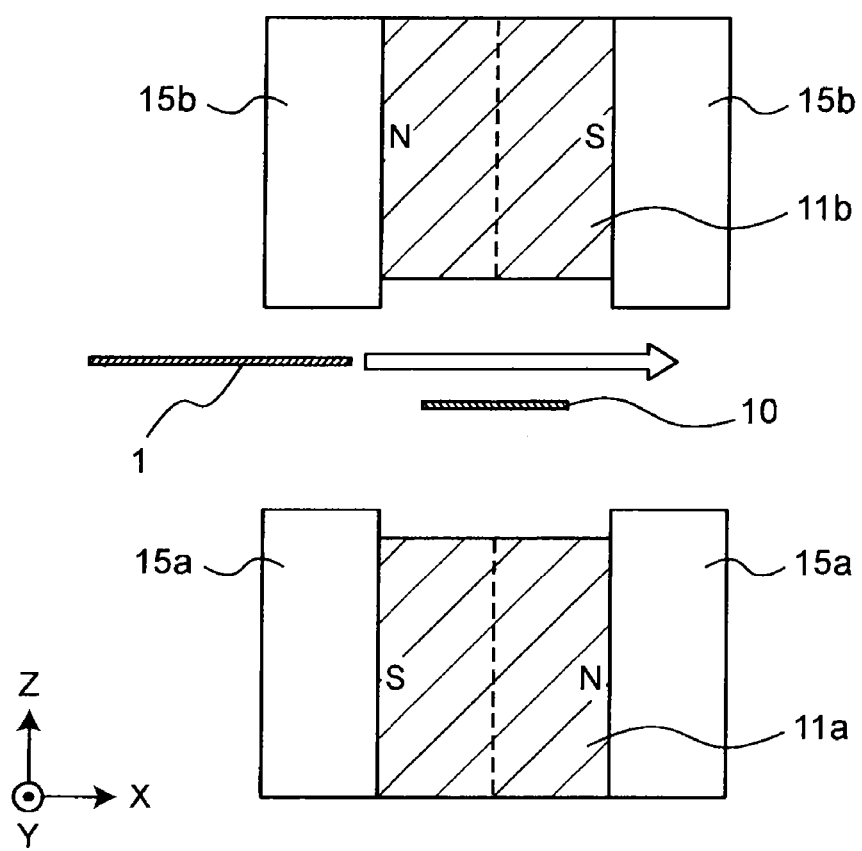
FIG. 36 is a side view showing an example in which lower yokes and upper yokes are attached to both side surfaces of a lower magnet and an upper magnet in the configuration shown in FIG. 35.
Figure 38:
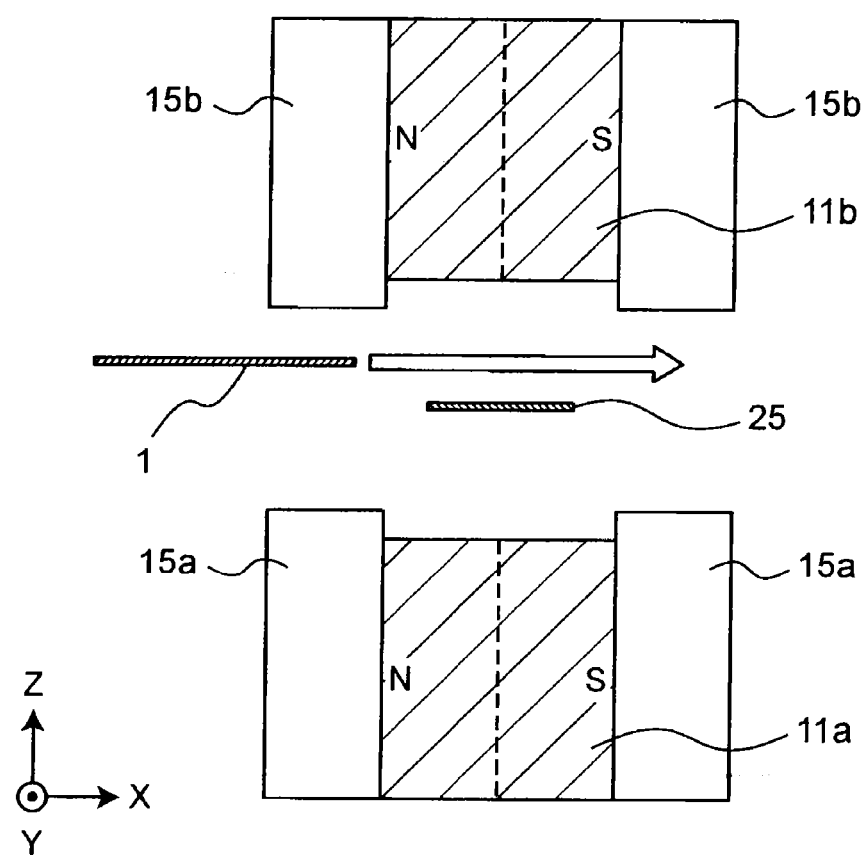
FIG. 38 is a side view showing an example in which the lower yokes and the upper yokes are attached to both the side surfaces of the lower magnet and the upper magnet in the configuration shown in FIG. 37.

Moreover, FIGS. 36 and 38 are side views showing examples in which the lower yokes 15a and the upper yokes 15b are attached to both side surfaces of the lower magnet 11a and the upper magnets 11b in each of the configurations shown in FIGS. 35 and 37, respectively. In this manner, the yokes 15a and 15b made of a soft magnetic substance are attached to magnetic pole surfaces of the magnets 11a and 11b, thereby forming stable magnetic field distribution. In this case, the magnetic field component parallel to the movement direction of the magnetic substance 1 can be set more precisely by adjusting dimensions of the lower yokes 15a and 15b.

Embodiment 10

Figure 39:
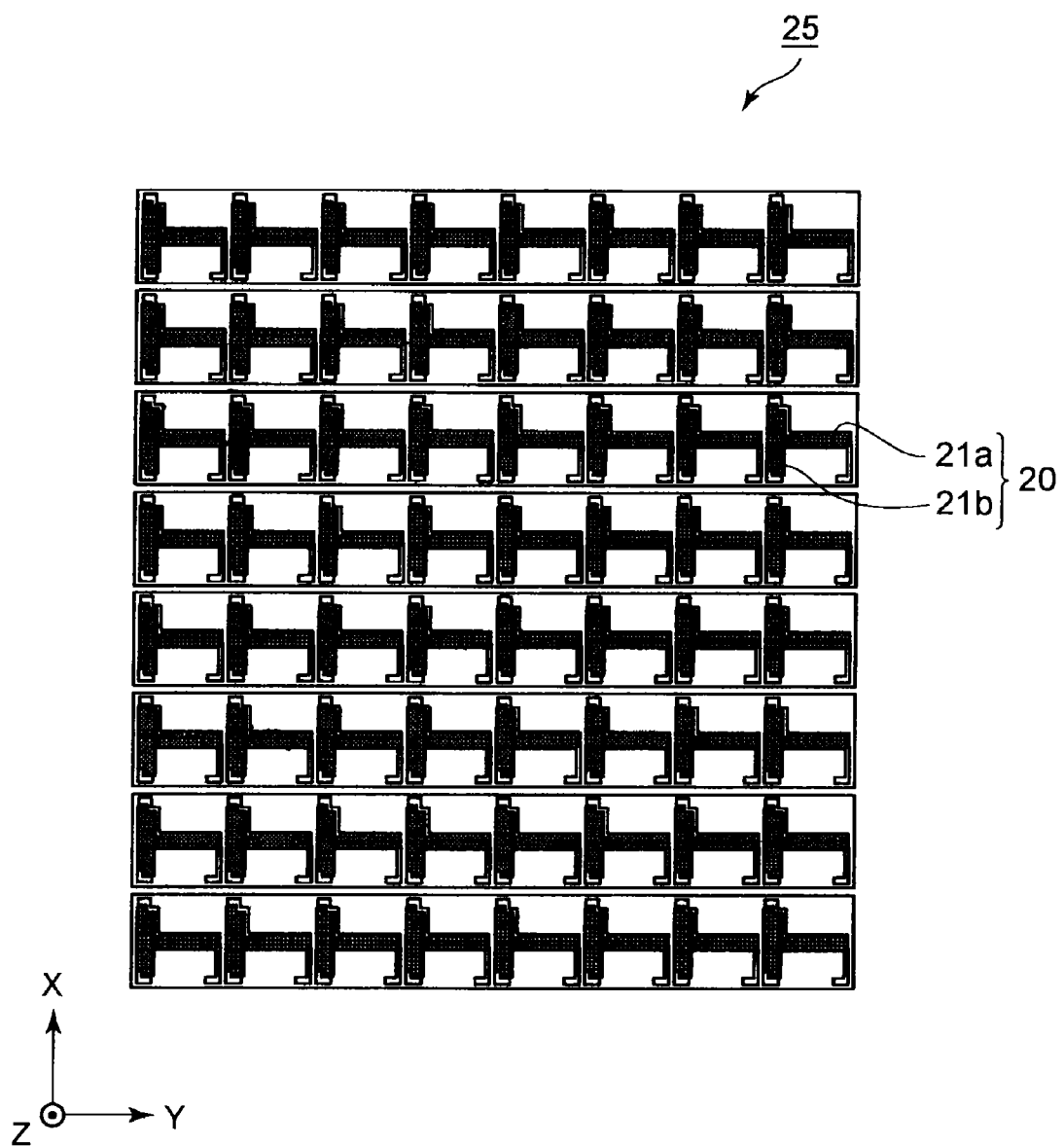
FIG. 39 is a plan view showing Embodiment 10 of the present invention.

FIG. 39 is a plan view showing Embodiment 10 of the present invention. As described in Embodiment 7, the magnetic image detection device includes the magnetic image sensor 25, the bias magnet (not shown), and the processing circuit (not shown).

The magnetic image sensor 25 is provided with a plurality of magnetoresistive sensors 20 arrayed in a matrix. Output signals from respective magnetoresistive sensors 20 are simultaneously or chronologically supplied to the processing circuit so as to be stored therein as a two-dimensional image signal.

Each of the magnetoresistive sensors 20 is made of two anisotropic magnetoresistive (AMR) elements 21a and 21b. The AMR elements 21a and 21b are formed to be a thin film pattern of a ferromagnetic substance on a substrate. When they are each formed in an elongated strip shape as illustrated, a direction which is perpendicular to the longitudinal direction thereof and parallel to the principal surface of the substrate is a magnetosensitive direction. In this embodiment, the magnetosensitive direction of the AMR element 21a is set to X-direction, and on the other hand, the magnetosensitive direction of the AMR element 21b is set to Y-direction.

The AMR elements 21a, 21b are connected in series between a power supply line Vcc and a ground line GND to build up a half bridge circuit. The midpoint potential thereof is supplied as an output signal to the subsequent processing circuit in which the output signal is subjected to amplification and various types of signal processing.

The bias magnet generates a magnetic field component parallel to X-direction as described in FIGS. 18, 25, 26, 28 and 34. Moreover, as described in FIGS. 20, 24, 27, 29 and 38, magnetic yokes may be attached to both side surfaces of this bias magnet, that is, an upstream side surface and a downstream side surface along X-direction in which the magnetic substance 1 moves.

In this embodiment, since the plurality of magnetoresistive sensors 20 are arrayed in a matrix, during magnetic reading, the two-dimensional image of a magnetic pattern can be captured with high resolution at high speed without moving the magnetic substance to be detected. This can remove any influence caused by speed fluctuation of the magnetic substance, thereby simplifying a conveyance mechanism of the magnetic substance and reducing a cost.

Moreover, since the magnetic image sensor 25 outputs the two-dimensional image similar to an output signal of an optical area sensor, image processing similar to image processing to an optical image can be applied, so that higher-accuracy magnetic pattern reading can be realized.

Embodiment 11

Figure 40:
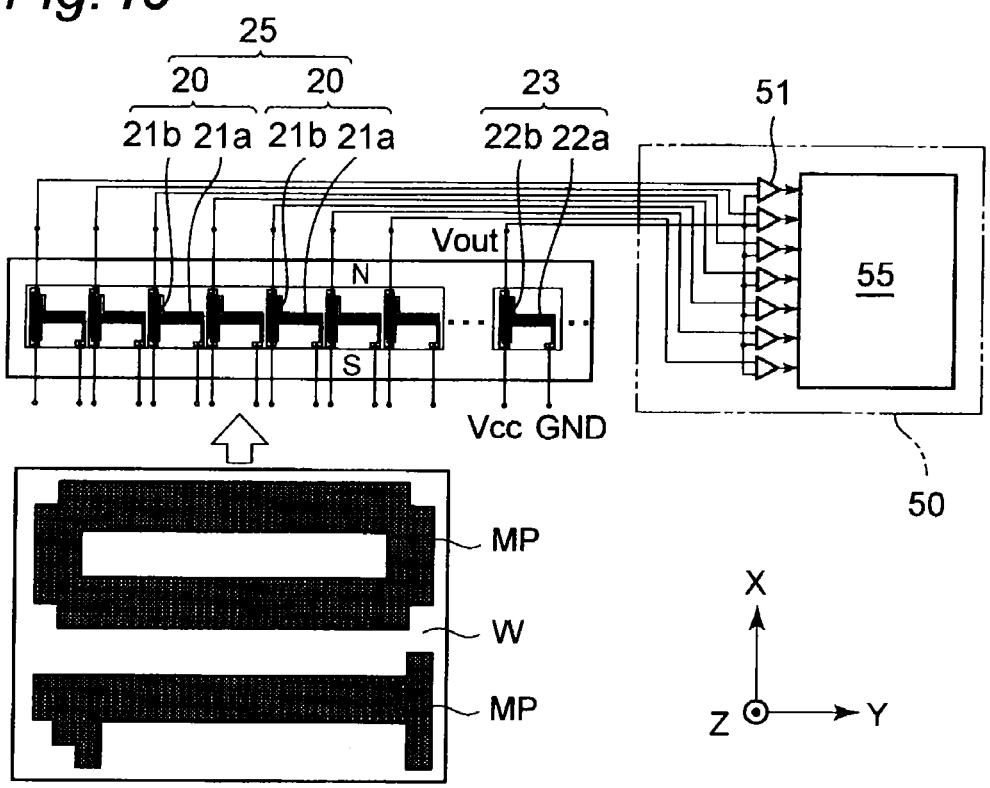
FIG. 40 is a configuration diagram showing Embodiment 11 of the present invention.

FIG. 40 is a configuration diagram showing Embodiment 11 of the present invention. As described in Embodiment 7, the magnetic image detection device includes the magnetic image sensor 25, the bias magnet (not shown), and the processing circuit 50.

The magnetic image sensor 25 is provided with a plurality of magnetoresistive sensors 20 arrayed linearly, and a magnetoresistive sensor for compensation 23 is provided outside the movement path of the magnetic substance 1. Each of the magnetoresistive sensors 20 is made of two anisotropic magnetoresistive (AMR) elements 21a and 21b. Here, an example is described in which as described in FIG. 30, each of the magnetoresistive sensors 20 is arranged so that the magnetosensitive direction of the AMR element 21a is set to X-direction, and the magnetosensitive direction of the AMR element 21b is set to Y-direction, but each of the magnetoresistive sensors 20 may be arranged so that the magnetosensitive directions of the AMR elements 21a and 21b are both set to X-direction, as shown in FIG. 18.

The AMR elements 21a and 21b are connected in series between a power supply line Vcc and a ground line GND to build up a half bridge circuit. The midpoint potential thereof is supplied as an output signal to the subsequent processing circuit 50 in which the output signal is subjected to amplification and various types of signal processing.

The magnetoresistive sensor for compensation 23 is also made up of two anisotropic magnetoresistive (AMR) element 22a and 22b in a manner similar to the magnetoresitive sensor 20, and element pattern arrangement as well coincides with that of the magnetoresistive sensor 20. The AMR elements 22a and 22b are connected in series between a power supply line Vcc and a ground line GND to build up a half bridge circuit, and the midpoint potential is supplied as a compensation signal to the processing circuit 50.

The bias magnet generates a magnetic field component parallel to X-direction as described in FIGS. 18, 25, 26, 28 and 34. Moreover, as described in FIGS. 20, 24, 27, 29 and 38, magnetic yokes may be attached to both side surfaces of this bias magnet, that is, an upstream side surface and a downstream side surface along X-direction in which the magnetic substance 1 moves.

The processing circuit 50 includes a plurality of differential amplifiers 51, a microcomputer 55 having an A/D converter, a computing unit, a memory and the like, and so on. The differential amplifier 51 is made up of an operational amplifier and the like, and the output signals from the respective magnetoresistive sensors 20 are inputted as non-inverting input, and the compensation signal from the magnetoresistive sensor for compensation 23 is inputted as inverting input to amplify a difference between both the signals. The microcomputer 55 converts the differential signal to a digital value to store the same in the memory and execute various types of signal processing.

As to operation, when the magnetic substance 1 moves in X-direction, the respective magnetoresistive sensors 20 read magnetic patterns MP of the magnetic substance 1. At this time, the magnetoresistive sensor for compensation 23 arranged outside the movement path of the magnetic substance 1 does not read the magnetic patterns MP, but produces an output fluctuation attributed to time degradation and temperature change of the bias magnet, the AMR elements, an attachment position thereof and the like. This output fluctuation are also superimposed on the output signals of the magnetoresistive sensors 20. Consequently, the differential amplifier 51 subtracts the above-described output fluctuation from the output signal of each of the respective magnetoresistive sensors 20 to compensate the output signal. As a result, a high-accuracy magnetic pattern image can be captured.

Embodiment 12

Figure 41:
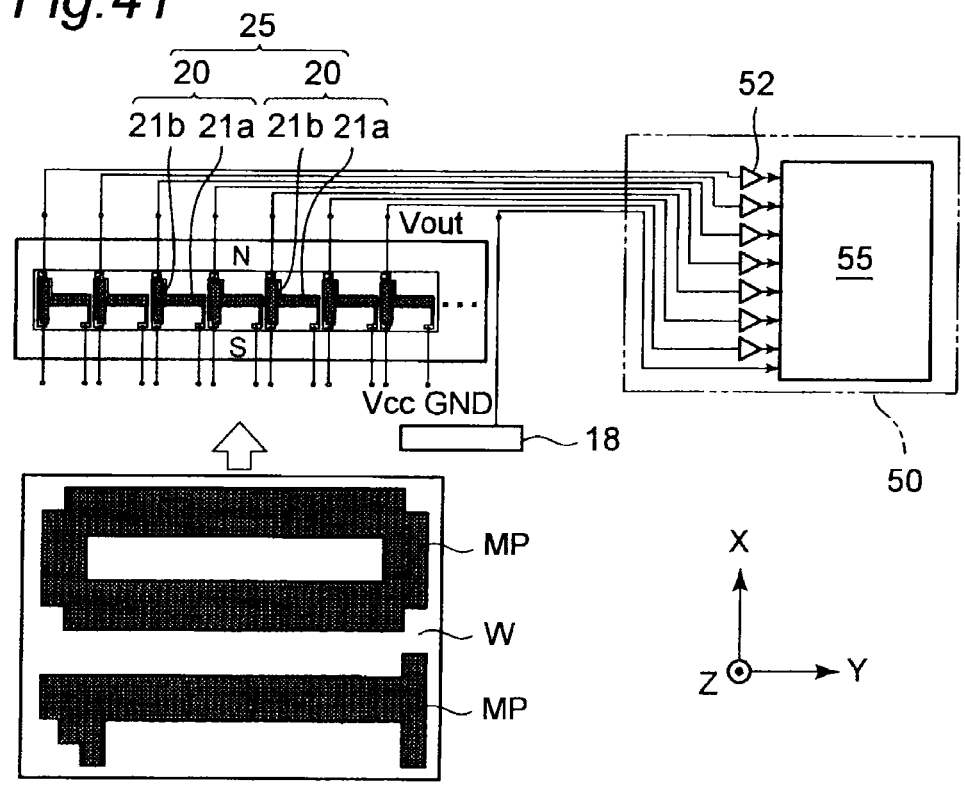
FIG. 41 is a configuration diagram showing Embodiment 12 of the present invention.

FIG. 41 is a configuration diagram showing Embodiment 12 of the present invention. As described in Embodiment 7, the magnetic image detection device includes the magnetic image sensor 25, the bias magnet (not shown), and the processing circuit 50.

In this embodiment, a magnetic substance sensing unit 18 for sensing the presence or absence of the magnetic substance 1 is provided. The magnetic substance sensing unit 18 is made up of, for example, a photointerruptor, a photoreflector, other various types of proximity sensors and the like. When the magnetic substance 1 moves along the movement path, the magnetic substance sensing unit 18 outputs a sensing signal to the processing circuit 50 before the magnetic substance 1 enters the magnetic image sensor 25. When the presence of the magnetic substance is sensed, the sensing signal becomes a first logical value (e.g., a high level), and when the presence is not sensed, the sensing signal becomes a second logical value (e.g., a low level).

The magnetic image sensor 25 is provided with plurality of magnetoresistive sensors 20 arrayed linearly. Each of the magnetoresistive sensors 20 is made of two anisotropic magnetoresistive (AMR) elements 21a and 21b. Here, an example is described in which as in described FIG. 30, each of the magnetoresistive sensors 20 is arranged so that the magnetosensitive direction of the AMR element 21a is set to X-direction, and a magnetosensitive direction of the AMR element 21b is set to Y-direction, but each of the magnetoresistive sensors 20 may be arranged so that the magnetosensitive directions of the AMR elements 21a and 21b are both set to X-direction, as shown in FIG. 18.

The AMR elements 21a and 21b are connected in series between a power supply line Vcc and a ground line GND to build up a half bridge circuit. The midpoint potential thereof is supplied as an output signal to the subsequent processing circuit 50 in which the output signal is subjected to amplification and various types of signal processing.

The bias magnet generates a magnetic field component parallel to X-direction as described in FIGS. 18, 25, 26, 28 and 34. Moreover, as described in FIGS. 20, 24, 27, 29 and 38, magnetic yokes may be attached to both side surfaces of this bias magnet, that is, an upstream side surface and a downstream side surface along X-direction in which the magnetic substance 1 moves.

The processing circuit 50 includes a plurality of amplifiers 52, a microcomputer 55 having an A/D converter, a computing unit, a memory and the like, and so on. The amplifiers 52 each have a function of amplifying the output signal from each of the magnetoresistive sensors 20, wherein filter processing, offset processing and the like are performed as needed. The microcomputer 55 converts the signal from each of the amplifiers 52 to a digital value to store the same in the memory and execute various types of signal processing.

As to operation, when the magnetic substance 1 moves in X-direction, the magnetic substance sensing unit 18 first senses the magnetic substance 1. When the processing circuit 50 detects the inversion of the sensing signal, the processing circuit 50 stores the output signal from the magnetic image sensor 25 as an output signal S0 captured when the magnetic substance 1 is absent. This output signal S0 includes an output fluctuation attributed to time degradation and temperature change of the bias magnet, the AMR elements, the attachment position thereof and the like.

Subsequently, the magnetic substance 1 further moves, and the magnetic image sensor 25 reads magnetic patterns MP of the magnetic substance 1. At this time, the processing circuit 50 stores the output signal from the magnetic image sensor 25 as an output signal S1 captured when the magnetic substance 1 is present. The output fluctuation as described above is also superimposed on this output signal S1.

Thus, when the magnetic reading is completed, the output signal S0 can be subtracted from the output signal S1 to compensate the output signal S1. As a result, a high-accuracy magnetic pattern image can be captured.

Embodiment 13

Figure 42:
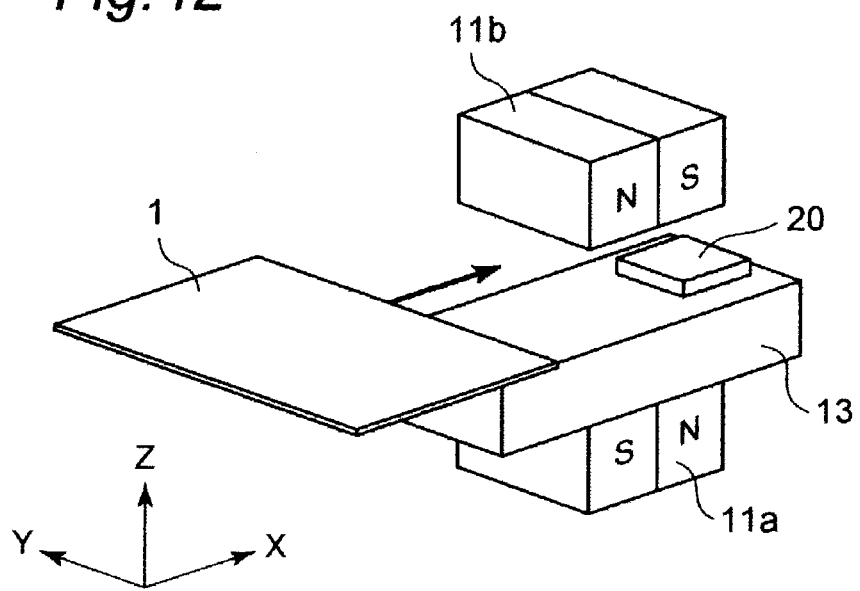
FIG. 42 is a perspective view showing Embodiment 13 of the present invention.
Figure 43:
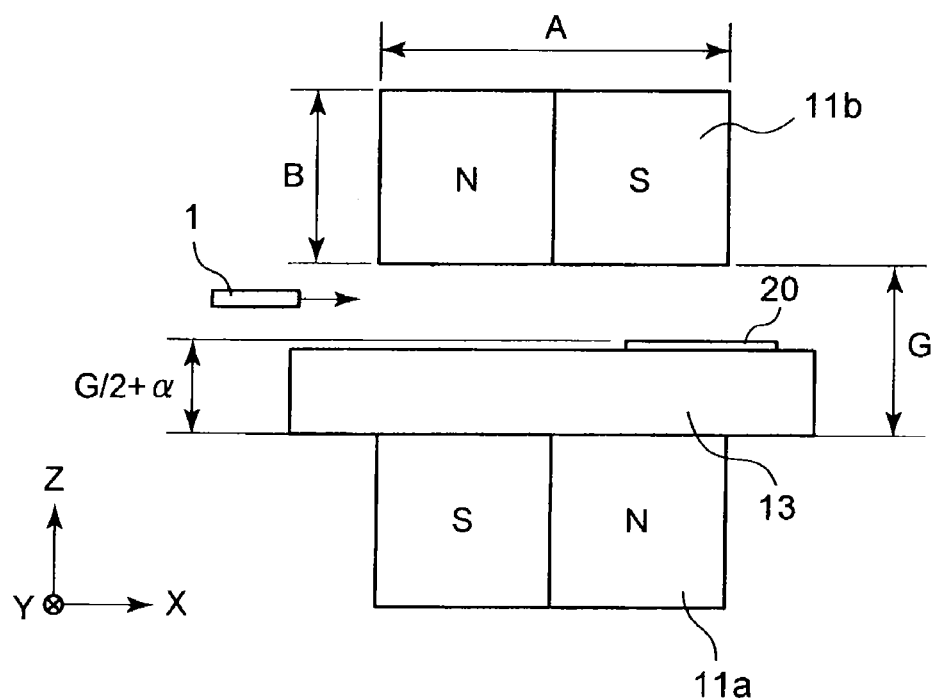
FIG. 43 is a side view showing Embodiment 13 of the present invention.

FIG. 42 is a perspective view showing Embodiment 13 of the present invention, and FIG. 43 is a side view thereof. This whole device is similar in configuration to Embodiment 1. The magnetoresistive substance detection device includes the lower magnet 11a, the upper magnet 11b, the spacer 13, and the magnetoresistive sensor 20, as shown in FIG. 42.

This embodiment is different in position of the magnetoresistive sensor 20 from Embodiment 1, in which the magnetoresistive sensor 20 is located around an in-plane (XY plane) center of the lower magnet 11a and the upper magnet 11b. In this embodiment the magnetoresistive sensor 20 is located on the downstream side of the movement direction (X-direction) of the magnetic substance 1.

Figure 44:
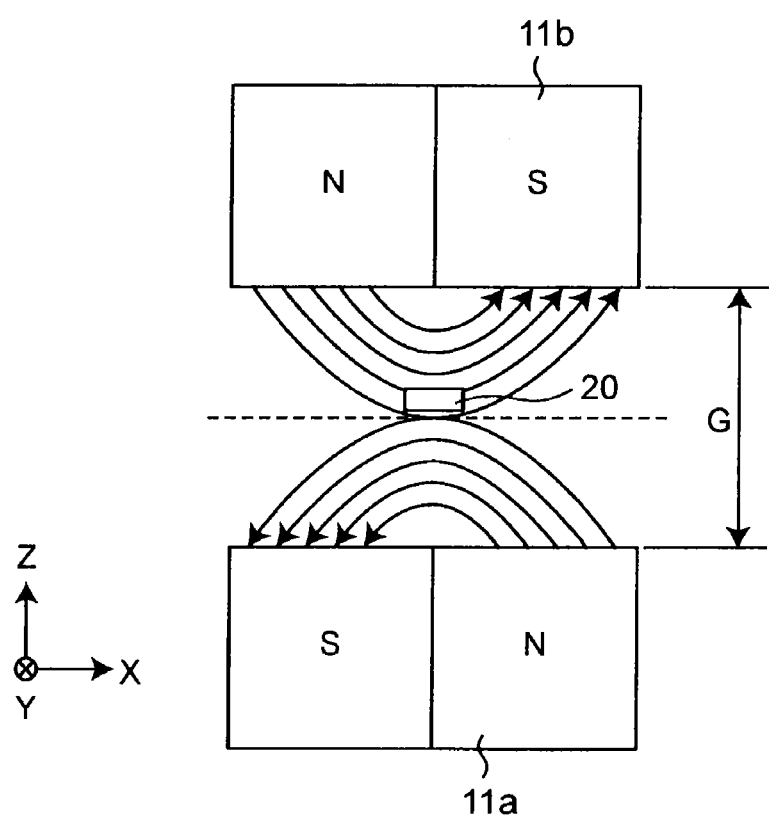
FIG. 44 is a side view showing magnetic line distribution in Embodiment 1 of the present invention.
Figure 45:
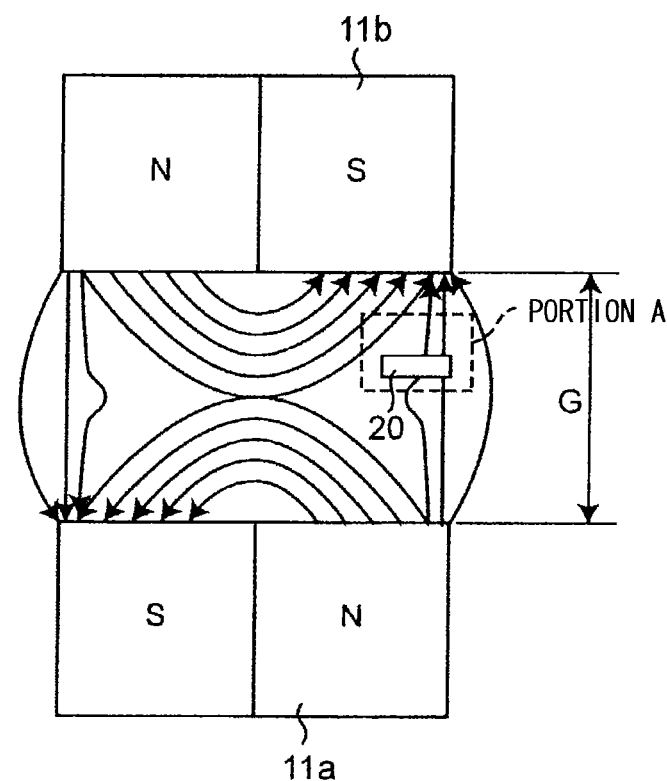
FIG. 45 is a side view showing magnetic line distribution in Embodiment 13 of the present invention.
Figure 46A:
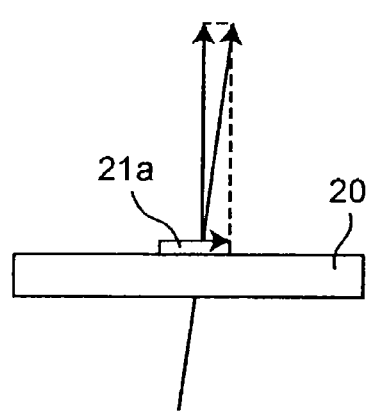
FIGS. 46A and 46B are enlarged views of a portion A in FIG. 45, FIG. 46A showing magnetic line distribution when a magnetic substance is absent, and FIG. 46B showing the magnetic line distribution when the magnetic substance is present.
Figure 46B:
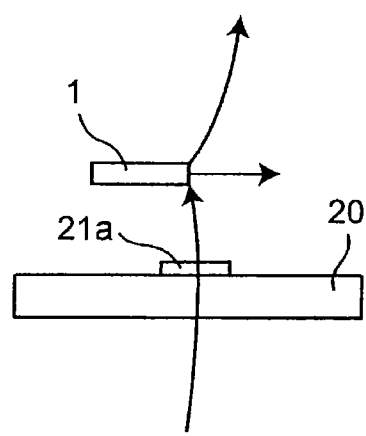

Here, differences in function between Embodiment 1 and this embodiment will be described. In Embodiment 1, as shown in FIG. 44, by locating the magnetoresistive sensor slightly above the magnetic field zero point in Z-direction, increase and decrease of the magnetic field in the magnetic substance movement direction (X-direction) when the magnetic substance 1 passes between the magnetoresistive sensor 20 and the upper magnet 11b is detected by the AMR element 21a on the magnetoresistive sensor 20. In this embodiment, as shown in FIG. 45, the magnetoresistive sensor 20 is located on the downstream side of the movement direction (X-direction) of the magnetic substance 1, whereby a magnetic field slightly inclined to X-direction with respect to a penetrating direction (Z-direction) is applied to the magnetoresistive sensor 20. FIG. 46A shows an enlarged portion A in FIG. 45. When the magnetic substance is absent, the magnetic field slightly inclined to X-direction with respect to the penetrating direction (Z-direction) is applied to the magnetoresistive sensor 20, a component of this magnetic substance movement direction (X-direction) is applied to the AMR element 21a on the magnetoresistive sensor 20 as a bias magnetic field.

In this case, when the magnetic substance 1 passes between the magnetoresistive sensor 20 and the upper magnet 1b, distortion of magnetic lines occurs at an end portion of the magnetic substance, as shown in 46B, so that the component in X-direction of the magnetic field applied to the AMR element 21a on the magnetoresistive sensor is changed. Particularly, in the case where the magnetic substance 1 passes through in a vicinity of the magnetoresistive sensor 20, the change of direction of the magnetic lines applied to the magnetoresistive sensor 20 becomes larger, and the change of component in X-direction also becomes larger. Therefore, by applying the magnetic field slightly inclined to X-direction with respect to the penetrating direction (Z-direction) to the magnetoresistive sensor 20 as the bias magnetic field, the change of the magnetic field in X-direction of the AMR element 21a having a magnetosensitive direction in X-direction becomes larger when the magnetic substance passes by. Thus, signal output can be increased, thereby obtaining the stable signal output. Here, the case where the magnetoresistive sensor 20 is made up of the AMR elements is exemplified, but the magnetoresistive sensor 20 may be made up of semiconductor magnetoresistive (SMR) elements, giant magnetoresistive (GMR) elements, tunnel magnetoresistive (TMR) elements or the like.

Further, as a method of applying the magnetic field slightly inclined to X-direction with respect to the penetrating direction (Z-direction) to the magnetoresistive sensor 20, in addition to the method according to this embodiment, there is assumed a form in which one or two magnets each having a south pole/a north pole magnetized in Z-direction are arranged in opposition. However, while in the case where the magnet having the south pole/the north pole magnetized in Z-direction is used, the magnetic substance is conveyed in the relatively uniformly strong magnetic field in Z-direction. In this embodiment, the magnetic field component in X-direction around the in-plane (XY plane) center of the lower magnet 11a and the upper magnet 11b is strong, and the magnetic field component in Z-direction is strong in a vicinity where the magnetoresistive sensor 20 is located on the downstream side of the movement direction (X-direction), and thus, the change of the magnetic field in the magnetosensitive direction (X-direction) of the magnetoresistive sensor 20 during conveyance of the magnetic substance becomes larger, thereby realizing the stable magnetic substance detection with higher output.

In this embodiment only the difference from Embodiment 1 is described. This embodiment can be applied to all the other embodiments (Embodiments 1 to 12) with similar effects by locating the magnetoresistive sensor 20 on the downstream side of the movement direction (X-direction) of the magnetic substance 1.

EXPLANATORY NOTE

1: magnetic substance, 1a: through-hole, 11a: lower magnet, 11b: upper magnet, 13: spacer, 14: processing circuit,
15a: lower yoke, 15b: upper yoke,
18: magnetic substance sensing unit, 20: magnetoresistive sensor,
21a to 21f, 22a and 22b: AMR element,
23: magnetoresistive sensor for compensation,
25: magnetic image sensor, 50: processing circuit,
51: differential amplifier, 52: amplifier, 55: microcomputer,
MP: magnetic pattern, PA: lateral stripe magnetic pattern,
PB: longitudinal stripe magnetic pattern,
PC: gradation magnetic pattern,
PD: triangle-shaped magnetic pattern

The invention claimed is:

1. A magnetic substance detection device for detecting a magnetic substance, comprising:
    a magnetoresistive sensor arranged in a middle of a movement path of the magnetic substance;
    a first bias magnet in which a first magnetic pole and a second magnetic pole having a reverse polarity to the first magnetic pole are arrayed along a movement direction of the magnetic substance; and
    a second bias magnet in which a second magnetic pole and a first magnetic pole are arrayed along the movement direction of the magnetic substance, wherein:
        the first bias magnet and the second bias magnet are arranged with the movement path of the magnetic substance interposed so that the first magnetic pole of the first bias magnet and the second magnetic pole of the second bias magnet are opposed to each other so as to sandwich the magnetoresistive sensor and the magnetic substance to be detected, and so that the second magnetic pole of the first bias magnet and the first magnetic pole of the second bias magnet are opposed to each other,
        a magnetic field gradient is created in a surrounding of a zero point at which a bias magnetic field distribution formed by the first and second bias magnets becomes zero, the magnetic field gradient increasing a magnetic field component (Bx) parallel to the movement direction of the magnetic substance as approaching from the zero point to the first and second bias magnets,
        a center of the magnetoresistive sensor in the movement direction of the magnetic substance, is positioned at an offset position ($\alpha$) away from the zero point in a direction orthogonal to the movement direction of the magnetic substance,
        the zero point is located at a position where a plane intersects the zero point and a center of the first bias magnet in the movement direction of the magnetic substance and a center of the second bias magnet in the movement direction of the magnetic substance, and
        the movement path of the magnetic substance is positioned so that a magnetic field component (Bx) larger than the magnetic field component (Bx) at the offset position ($\alpha$) is applied to the magnetic substance.

2. The magnetic substance detection device according to claim 1, wherein
    the magnetoresistive sensor includes an anisotropic magnetoresistive element and is arranged around an intermediate portion of the first magnetic pole and the second magnetic pole of at least one of the first bias magnet and second bias magnet with respect to the movement direction of the magnetic substance,
    a bias magnetic field in the movement direction of the magnetic substance applied to the magnetoresistive element by the first bias magnet or a pair of the first bias magnet and the second bias magnet is increased or decreased by a passage of the magnetic substance, and
    a change of a magnetic field is converted to output by the magnetoresistive sensor.

3. The magnetic substance detection device according to claim 1, wherein
    the magnetoresistive sensor includes an anisotropic magnetoresistive element, and is arranged around a front side of the first magnetic pole of the second bias magnet or a rear side of the second magnetic pole of the second bias magnet with respect to the movement direction of the magnetic substance,
    a component in a penetrating direction of a bias magnetic field applied to the magnetoresistive element by the first bias magnet or a pair of the first bias magnet and the second bias magnet is rotated by a passage of the magnetic substance, and
    a change of a magnetic field is converted to output by the magnetoresistive sensor.

4. The magnetic substance detection device according to claim 1, wherein the magnetoresistive sensor includes a half bridge circuit which is built up of both a first anisotropic magnetoresistive element having a magnetosensitive direction parallel to the movement direction of the magnetic substance and a second anisotropic magnetoresistive element having a magnetosensitive direction perpendicular to the movement direction of the magnetic substance.

5. The magnetic substance detection device according to claim 1, wherein a plurality of magnetoresistive sensors are arranged in a direction perpendicular to the movement direction of the magnetic substance to be constructed as a line sensor.

6. The magnetic substance detection device according to claim 1, further comprising:
    magnetic yokes provided on upstream and downstream side surfaces in the movement direction of the magnetic substance of the first bias magnet and the second bias magnet.

7. The magnetic substance detection device according to claim 6, wherein the magnetic yokes are provided so as to project from opposed surface of the first bias magnet or the second bias magnet toward the magnetoresistive sensor.

8. The magnetic substance detection device according to claim 1, wherein the first bias magnet and the second bias magnet are each formed of a prism-shaped magnet of a both-face four-pole magnetization pattern.

9. The magnetic substance detection device according to claim 1, wherein the bias magnet is divided into a plurality of magnetic poles along an array direction of the magnetoresistive sensors.

10. The magnetic substance detection device according to claim 1, wherein:
- a magnetoresistive sensor for compensation is arranged outside the movement path of the magnetic substance,
- the magnetoresistive sensor and the magnetoresistive sensor for compensation includes a half bridge circuit which is built up of both a first anisotropic magnetoresistive element and a second anisotropic magnetoresistive element, and
- a processing circuit is provided for compensating an output signal from each of the magnetoresistive sensors using an output signal from the magnetoresistive sensor for compensation.

11. The magnetic substance detection device according to claim 1, further comprising:
- a plurality of magnetoresistive sensors;
- a processing circuit for processing an output signal from each of the magnetoresistive sensors; and
- a magnetic substance sensing unit for supplying a sensing signal indicating presence or absence of the magnetic substance in the movement path to the processing circuit, the magnetic substance sensing unit being located on an upstream side of the movement path of the magnetic substance with respect to the magnetoresistive sensors,
- wherein the processing circuit compensates the output signal when the magnetic substance is present, using the output signal when the magnetic substance is absent immediately before the magnetic substance passes through each of the magnetoresistive sensors while moving along the movement path.

12. The magnetic substance detection device according to claim 1, further comprising:
- a plurality of magnetoresistive sensors arrayed linearly or in a matrix,
- wherein each of the magnetoresistive sensors includes a plurality of anisotropic magnetoresistive elements formed to be a thin film pattern of a ferromagnetic substance on a substrate, and
- the respective anisotropic magnetoresistive elements have magnetosensitive directions parallel to a principal surface of the substrate, and parallel or perpendicular to one another.

13. The magnetic substance detection device according to claim 1, wherein:
- the magnetic substance to be detected has a slit shape formed with a certain pitch (P) along the movement direction,
- the magnetoresistive sensors includes a first, a second, a third and a fourth anisotropic magnetoresistive elements each having a magnetosensitive direction parallel to the movement direction of the magnetic substance, the anisotropic magnetoresistive elements being sequentially arranged at an interval of P/4 in the movement direction of the magnetic substance,
- the first and the third anisotropic magnetoresistive elements build up a first half bridge circuit, and the second and the fourth anisotropic magnetoresistive elements build up a second half bridge circuit, and
- the magnetic substance detection device further comprises a processing circuit for calculating an amount of movement and the movement direction of the magnetic substance, based on a signal of the magnetoresistive sensor.

* * * * *